United States Patent
Shimizu

(12) 
(10) Patent No.: US 11,557,486 B2
(45) Date of Patent: Jan. 17, 2023

(54) ETCHING METHOD, DAMAGE LAYER REMOVAL METHOD, AND STORAGE MEDIUM

(71) Applicant: TOKYO ELECTRON LIMITED, Tokyo (JP)

(72) Inventor: Akitaka Shimizu, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/027,327

(22) Filed: Sep. 21, 2020

(65) Prior Publication Data
US 2021/0090896 A1 Mar. 25, 2021

(30) Foreign Application Priority Data
Sep. 24, 2019 (JP) .............................. JP2019-172528

(51) Int. Cl.
*H01L 21/311* (2006.01)
*H01L 21/3065* (2006.01)
(Continued)

(52) U.S. Cl.
CPC .... *H01L 21/31116* (2013.01); *H01L 21/3065* (2013.01); *H01L 21/67069* (2013.01);
(Continued)

(58) Field of Classification Search
CPC ........... H01J 37/32357; H01J 37/32422; H01J 37/32522; H01J 37/32816; H01L 21/02063; H01L 21/02236; H01L 21/02238; H01L 21/3065; H01L 21/31116; H01L 21/31138; H01L 21/67069; H01L 21/67207;
(Continued)

(56) References Cited

U.S. PATENT DOCUMENTS

2009/0302002 A1* 12/2009 Collins ............. H01L 21/31138
 216/67
2010/0105209 A1* 4/2010 Winniczek ........ H01J 37/32082
 438/696
(Continued)

FOREIGN PATENT DOCUMENTS

JP H06-236864 A 8/1994
JP H09162172 A 6/1997
(Continued)

*Primary Examiner* — Lan Vinh
(74) *Attorney, Agent, or Firm* — Fenwick & West LLP

(57) ABSTRACT

An etching method includes preparing a substrate having an etching target portion formed on a silicon-containing portion, plasma-etching the etching target portion of the substrate into a predetermined pattern by plasma of a processing gas containing a CF-based gas, and removing a damage layer formed due to implantation of C and F into the silicon-containing portion exposed at a bottom of the predetermined pattern by the plasma etching. The removing of the damage layer includes forming an oxide of the damage layer by supplying oxygen-containing radicals and fluorine-containing radicals and oxidizing the damage layer with the oxygen-containing radicals while etching the damage layer with the fluorine-containing radicals, and removing the oxide by a radical treatment or a chemical treatment with a gas.

20 Claims, 15 Drawing Sheets

(51) Int. Cl.
*H01L 21/67* (2006.01)
*H01L 21/02* (2006.01)

(52) U.S. Cl.
CPC .............. *H01L 21/02236* (2013.01); *H01L 21/02238* (2013.01); *H01L 21/31138* (2013.01)

(58) Field of Classification Search
CPC ......... H01L 21/30655; H01L 21/02164; H01L 21/31144; G03F 7/42
USPC ....... 438/706, 710, 712, 714, 719, 723, 725, 438/736, 758, 705
See application file for complete search history.

(56) References Cited

U.S. PATENT DOCUMENTS

| | | | | |
|---|---|---|---|---|
| 2013/0109187 A1* | 5/2013 | Nemani | ............ | H01L 21/02063 438/710 |
| 2014/0199846 A1* | 7/2014 | Meng | ................ | H01L 21/76831 438/700 |
| 2015/0252311 A1* | 9/2015 | Takahashi | ................ | C11D 7/08 438/720 |

FOREIGN PATENT DOCUMENTS

| | | | |
|---|---|---|---|
| JP | 2006049808 | A | 2/2006 |
| JP | 4282616 | B2 | 6/2009 |
| KR | 10-2007-0036475 | A | 4/2007 |
| KR | 10-2015-0141135 | A | 12/2015 |

\* cited by examiner

AFTER ETCHING

AFTER TREATMENT
WITH OXYGEN-
CONTAINING RADICALS
AND FLUORINE-
CONTAINING RADICALS

AFTER REMOVAL
OF OXIDE

AFTER ETCHING

AFTER TREATMENT
WITH OXYGEN-
CONTAINING RADICALS
AND FLUORINE-
CONTAINING RADICALS

AFTER REMOVAL
OF OXIDES

AFTER ETCHING

AFTER TREATMENT
WITH OXYGEN-
CONTAINING RADICALS
AND FLUORINE-
CONTAINING RADICALS

AFTER TREATMENT
WITH OXYGEN-
CONTAINING RADICALS
AND FLUORINE-
CONTAINING RADICALS

AFTER ETCHING

AFTER ASHING

AFTER TREATMENT
WITH OXYGEN-
CONTAINING RADICALS
AND FLUORINE-
CONTAINING RADICALS

ETCHING METHOD, DAMAGE LAYER REMOVAL METHOD, AND STORAGE MEDIUM

CROSS-REFERENCE TO RELATED APPLICATIONS

This application claims priority to Japanese Patent Application No. 2019-172528, filed on Sep. 24, 2019, the entire contents of which are incorporated herein by reference.

TECHNICAL FIELD

The present disclosure relates to an etching method, a damage layer removal method, and a storage medium.

BACKGROUND

In a semiconductor device manufacturing process, there is a step of etching an oxide film. A plasma etching with a processing gas containing a CF-based gas is often used for etching the oxide film. After the plasma etching with the gas containing the CF-based gas is performed, a damage layer is formed in an etched pattern, for example, a contact hole, a via hole, or another connection hole.

As an example of a method for removing the damage layer, Japanese Patent No. 4282616 discloses a technique in which plasma excited by an oxidizing gas is supplied to dry-clean a damage layer, a product produced in a connection hole as a result of the dry cleaning is removed by wet cleaning, and an oxide film remaining in the connection hole is removed by etching. Further, Japanese Patent Application Publication No. H06-236864 discloses a technique in which an ashing treatment is performed with a processing gas containing $O_2$, and then a processing gas in which $CF_4$ gas and $O_2$ gas are mixed is supplied and plasma of the processing gas is generated to remove a damage layer adhered onto the bottom of an etching hole.

The present disclosure provides a technique capable of sufficiently removing a damage layer formed in a pattern that is formed after a plasma etching with a gas containing a CF-based gas is performed.

SUMMARY

In accordance with an aspect of the present disclosure, there is provided an etching method including: preparing a substrate having an etching target portion formed on a silicon-containing portion; plasma-etching the etching target portion of the substrate into a predetermined pattern by plasma of a processing gas containing a CF-based gas; and removing a damage layer formed due to implantation of C and F into the silicon-containing portion exposed at a bottom of the predetermined pattern by the plasma etching. Further, the removing of the damage layer includes forming an oxide of the damage layer by supplying oxygen-containing radicals and fluorine-containing radicals and oxidizing the damage layer with the oxygen-containing radicals while etching the damage layer with the fluorine-containing radicals, and removing the oxide of the damage layer by a radical treatment or a chemical treatment with a gas.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, embodiments will be described with reference to the accompanying drawings.

<Background and Outline>

First, the background and outline of an etching method according to an embodiment of the present disclosure will be described.

In the semiconductor device manufacturing process, when an etching target portion, formed on a Si-containing portion such as Si or SiGe, is plasm-etched using a gas containing a CF-based gas, C and F are implanted into the Si-containing portion exposed at the bottom of an etched pattern (recess), which results in the formation of a damage layer.

In view of the above, Japanese Patent No. 4282616 discloses a technique in which plasma excited by an oxidizing gas is supplied to dry-clean a damage layer, a product produced in a connection hole as a result of the dry cleaning is removed by a wet cleaning, and an oxide film remaining in the connection hole is removed by etching. Further, Japanese Patent Application Publication No. H06-236864 discloses a technique in which an ashing treatment is performed with a processing gas containing $O_2$, and then a processing gas in which $CF_4$ gas and $O_2$ gas are mixed is supplied and plasma of the processing gas is generated to remove a damage layer adhered onto the bottom of an etching hole.

However, the above-described techniques may not reach the level of removing the damage layer that has recently been required.

Therefore, in the embodiment, there is provided a method for effectively removing a damage layer that is formed due to the implantation of C and F into a Si-containing portion when an etching target portion of a substrate is etched into a predetermined pattern by plasma of a processing gas containing a CF-based gas.

In other words, in the embodiment, after plasma etching is performed, a treatment with oxygen-containing radicals and fluorine-containing radicals is performed first. The damage layer is etched by the fluorine-containing radicals, and the residual of the damage layer left unetched is modified into an oxide. Then, the oxide of the damage layer (the oxidized damage layer) is removed by a radical treatment or a chemical treatment with a gas.

As described above, the damage layer can be sufficiently removed by modifying the damage layer into the oxide and, then, removing the oxide of the damage layer.

First Embodiment

Figure 1:
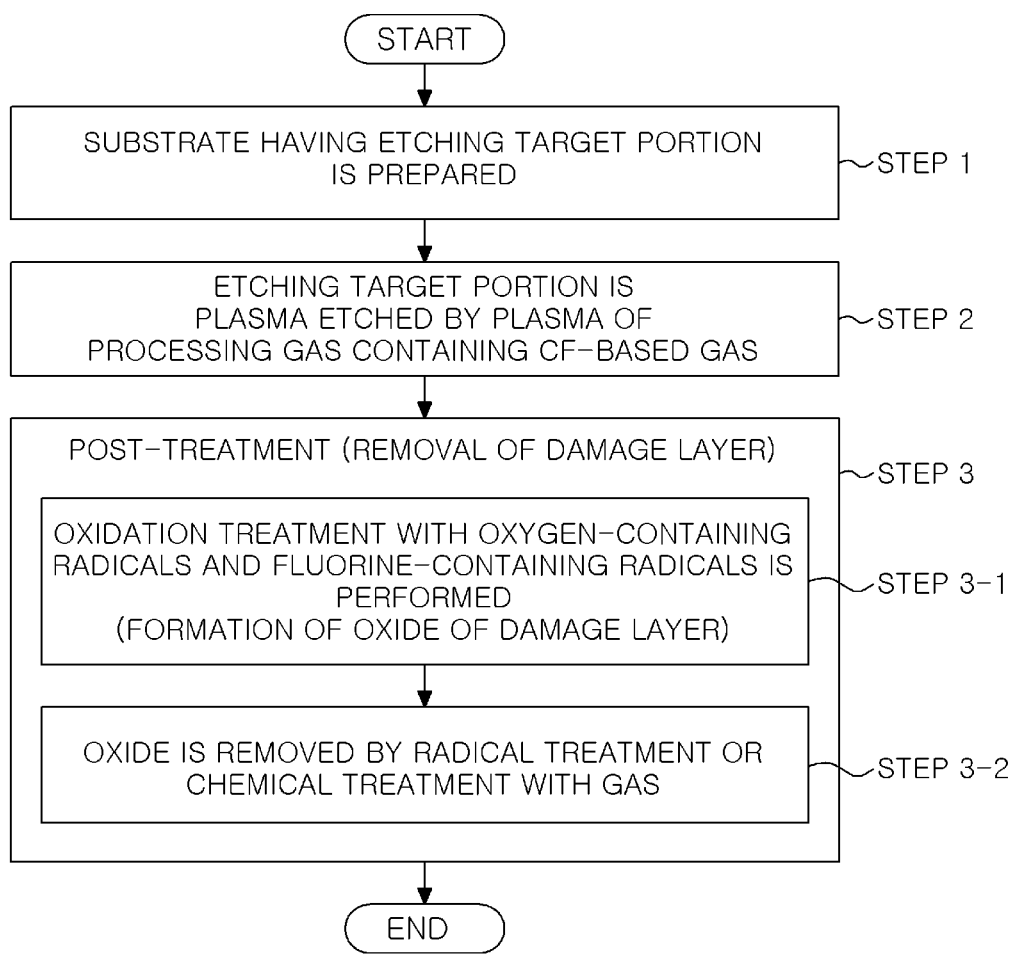
FIG. 1 is a flowchart showing an etching method according to a first embodiment.

Next, a first embodiment will be described in detail. FIG. 1 is a flowchart showing an etching method according to the first embodiment.

First, a substrate having an etching target portion is prepared (step 1). As for the substrate, a semiconductor wafer represented by a silicon wafer (hereinafter, simply referred to as "wafer") is exemplified, and a surface of the substrate may include a Si-containing portion such as Si or SiGe. A silicon oxide film ($SiO_2$ film) is exemplified as the etching target portion. Examples of the $SiO_2$ film include a thermal oxide film and a CVD film such as a TEOS film. The TEOS film is a CVD film using tetraethoxysilane (TEOS) as a Si precursor.

Next, the etching target portion of the substrate is etched into a predetermined pattern by plasma of a processing gas containing a CF-based gas (step 2). A fine pattern is formed through the etching. The CF-based gas is a gas containing carbon (C) and fluorine (F), and may be a gas composed of only C and F such as $CF_4$, $C_4F_6$, and $C_4F_8$ or a gas composed of C, F, and H such as $CH_2F_2$ and $CHF_3$. The processing gas may contain other gases such as Ar gas in addition to the CF-based gas. The etching of step 2 can be performed by general plasma etching, and a capacitively coupled parallel plate type plasma etching apparatus or a microwave plasma etching apparatus may be used therefor.

A fine pattern obtained through the plasma etching of the etching target portion has recesses such as trenches and holes, and C and F may be implanted into the Si-containing portion, such as Si or SiGe, that is exposed at the bottom of each recess formed by the etching, thereby forming a damage layer.

Therefore, after the etching in step 2 is performed, a post-treatment for removing the damage layer is performed (step 3).

In the post-treatment in step 3, first, an oxidation treatment with oxygen-containing radicals and fluorine-containing radicals is performed (step 3-1). The post-treatment in step 3 forms an oxide of the damage layer. Then, the oxide of the damage layer is removed by a radical treatment or a chemical treatment with a gas (step 3-2).

Figure 2A:
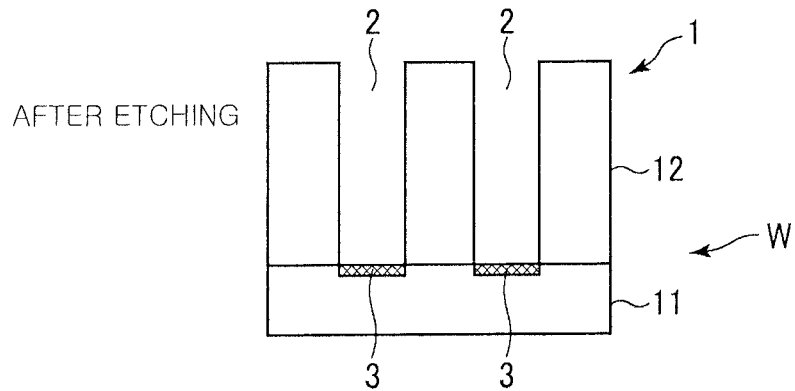
FIG. 2A is a schematic view showing a state of a wafer after a plasma etching is performed in the first embodiment.

More specifically, in the present embodiment, the wafer W that is a substrate has a structure in which, for example, an oxide film 12 is formed on a base 11, as shown in FIG. 2A. When the oxide film 12 is etched with plasma of a processing gas containing a CF-based gas and a pattern 1 having recesses 2 is formed, C and F are implanted into a Si-containing portion, such as Si or SiGe, of a surface of a substrate 11 that is exposed at the bottom of each recess 2. Thus, a damage layer 3 onto which C and F are implanted is formed.

Figure 2B:
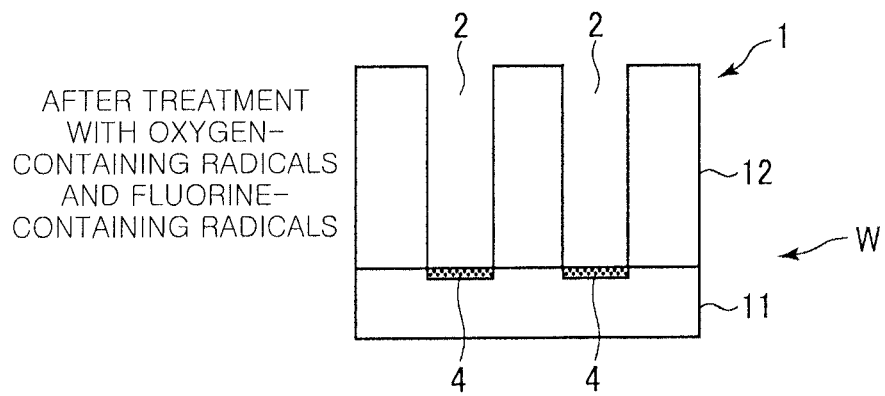
FIG. 2B is a schematic view showing a state of the wafer after a treatment with oxygen-containing radicals is performed in the first embodiment.

Next, when the treatment with the oxygen-containing radicals and the fluorine-containing radicals in step 3-1 is performed, the oxide 4 of the damage layer is formed as shown in FIG. 2B. At this time, if the damage layer is thin, the damage layer 3 may be oxidized by the oxygen-containing radicals alone. However, if the damage layer 3 is thick, the oxygen-containing radicals do not sufficiently reach the damage layer with the oxygen-containing radicals alone, resulting in insufficient oxidation of C and F in the damage layer 3.

In view of the above, in the embodiment, both of the oxygen-containing radicals and the fluorine-containing radicals are used. Since the damage layer 3 is easily etched by the fluorine-containing radicals, the surface of the damage layer 3 can be etched by the fluorine-containing radicals, so that the damage layer becomes thin. Therefore, the oxygen-containing radicals entirely reach the remaining damage layer 3, and the entire damage layer 3 can be oxidation-modified into the oxide 4.

Figure 2C:
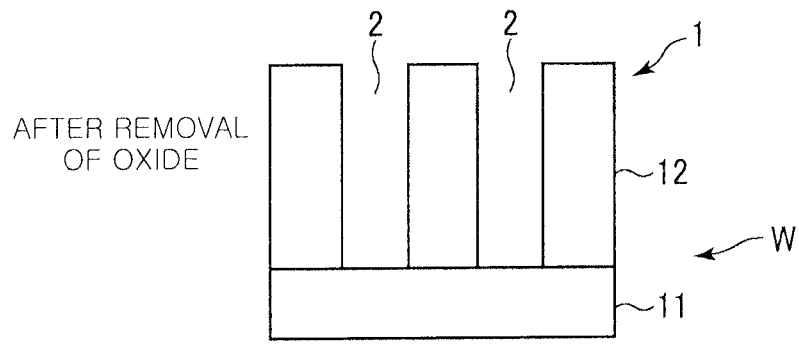
FIG. 2C is a schematic view showing a state of the wafer after an oxide removal treatment is performed in the first embodiment.

Thereafter, as shown in FIG. 2C, the oxide removal treatment of Step 3-2 is performed to remove the oxide 4 by a radical treatment or a chemical treatment with a gas.

The treatment of step 3-1 can be performed by generating plasma containing oxygen and fluorine and allowing the action of the oxygen-containing radicals and the fluorine-containing radicals in the plasma. The oxygen-containing radicals in the plasma are typically $O_2$ radicals or O radicals, and the fluorine-containing radicals are typically F radicals. Such a treatment is preferably performed using remote plasma. The remote plasma generates oxygen-containing plasma in a plasma generation space that is separate from a processing space where the substrate is placed, and the generated plasma is transferred to the processing space. Ions such as oxygen ions ($O_2$ ions) are easily deactivated during the transfer of the plasma, so that radical-based treatment can be performed by using the remote plasma. Using radicals can reduce the damages of the pattern. The plasma source is not particularly limited, and inductively coupled plasma, microwave plasma, or the like can be used.

As an example of the processing gas used to generate plasma, a gas containing an oxygen-containing gas and a fluorine-containing gas can be used. $O_2$ gas is suitable for the oxygen-containing gas. $H_2$ gas may be added to the oxygen-containing gas in order to enhance the oxidation. $NF_3$ gas, $SF_6$ gas, $F_2$ gas or the like can be used for the fluorine-containing gas. In addition, a noble gas may be added to the processing gas in order to stabilize the plasma. The noble gas is not particularly limited, but Ar gas is preferred. The volume ratio of the fluorine-containing gas to the oxygen-containing gas (fluorine-containing gas/oxygen-containing gas) during this treatment is preferably 1% (1% by volume (vol %)) or less. With such a ratio, the oxidation of the damage layer can be promoted while appropriately etching the damage layer alone without adversely affecting other portions.

The pressure in step 3-1 is preferably in a range of 13.3 to 266.6 Pa (100 to 2000 mTorr), and more preferably in a range of 26.6 to 133.3 Pa (200 to 1000 mTorr). Further, the substrate temperature at this time is preferably in a range of 0 to 120° C., more preferably in a range of 15 to 100° C.

Examples of the chemical treatment with a gas used for the treatment of removing the oxide of the damage layer in step 3-2 include a chemical treatment using a processing gas containing a fluorine-containing gas. By this treatment, the oxide of the damage layer reacts with the processing gas to generate a compound that can be removed by heating or the like.

Examples of the fluorine-containing gas contained in the processing gas include a hydrogen fluoride (HF) gas and the like, and the processing gas may further include $H_2O$ gas and a reducing gas in addition to the fluorine-containing gas. Examples of the reducing gas include an ammonia ($NH_3$) gas and an amine-based gas. The fluorine-containing gas with the $H_2O$ gas or the reducing gas reacts with the oxide of the damage layer, so that there can be produced a compound that can be relatively easy to be removed.

In the processing gas, it is preferable to use HF gas as the fluorine-containing gas and $NH_3$ gas as the reducing gas. With the HF gas and the $NH_3$ gas, it is possible to perform a chemical oxide removal (COR) treatment conventionally known as an oxide removal process. In the COR treatment, the HF gas and the $NH_3$ gas are adsorbed on the surface of the oxide and react with the oxide to generate an ammonium fluoride-based compound is produced. Then, a heat treatment for sublimating the ammonium fluoride-based compound is performed. Since the damage layer is formed by implanting C and F into the Si-containing portion, the oxide of the damage layer includes a silicon oxide ($SiO_2$) and oxides of C and F. Therefore, the ammonium fluoride-based compound includes, for example, ammonium hexafluorosilicate formed of HF and $NH_3$ with $SiO_2$.

The heat treatment may be performed in a device separate from a device for performing the reaction treatment, or the heat treatment and the reaction treatment may be repeatedly performed in the chamber for performing the reaction treatment to sublimate the ammonium fluoride-based compound.

In such a COR treatment, the pressure is preferably in a range of 6.66 to 400 Pa (50 to 3000 mTorr), and more preferably in a range of 13.3 to 266.6 Pa (100 to 2000 mTorr). The temperature of the substrate at this time is preferably in a range of 0 to 120° C., and more preferably in a range of 20 to 100° C.

The radical treatment, which is used to remove the oxide of the damage layer in step 3-2, may be performed using F radicals and N radicals formed by activating a processing gas containing $NF_3$ gas and $NH_3$ gas. Such a radical treatment may be performed preferably using the remote plasma that generates plasma of a gas containing $NF_3$ gas and $NH_3$ gas is generated in a plasma generation space that is separate from a processing space where the substrate is placed and transfers the generated plasma to the processing space. Further, in addition to the $NF_3$ gas and the $NH_3$ gas, $H_2$ gas may be added.

The pressure at the radical treatment is preferably in a range of 13.3 to 200 Pa (100 to 1500 mTorr), and more preferably in a range of 66.7 to 160 Pa (500 to 1200 mTorr). Further, the temperature of the substrate is preferably in a range of 0 to 120° C., and more preferably in a range of 15 to 100° C. When step 3-2 is performed by such a radical treatment, the chamber for performing the oxidation treatment of step 3-1 can be used for the radical treatment.

Even though the damage layer can be removed by Step 3-1 and Step 3-2, Step 3-1 and Step 3-2 may be repeated in order to completely remove the damage layer.

According to the present embodiment, in the post-treatment for removing the damage layer after the step of the plasma etching with the processing gas containing the CF-based gas, the oxide removal treatment is performed after the damage layer is almost completely oxidation-modified. Thus, the damage layer can be sufficiently removed.

Second Embodiment

Figure 3:
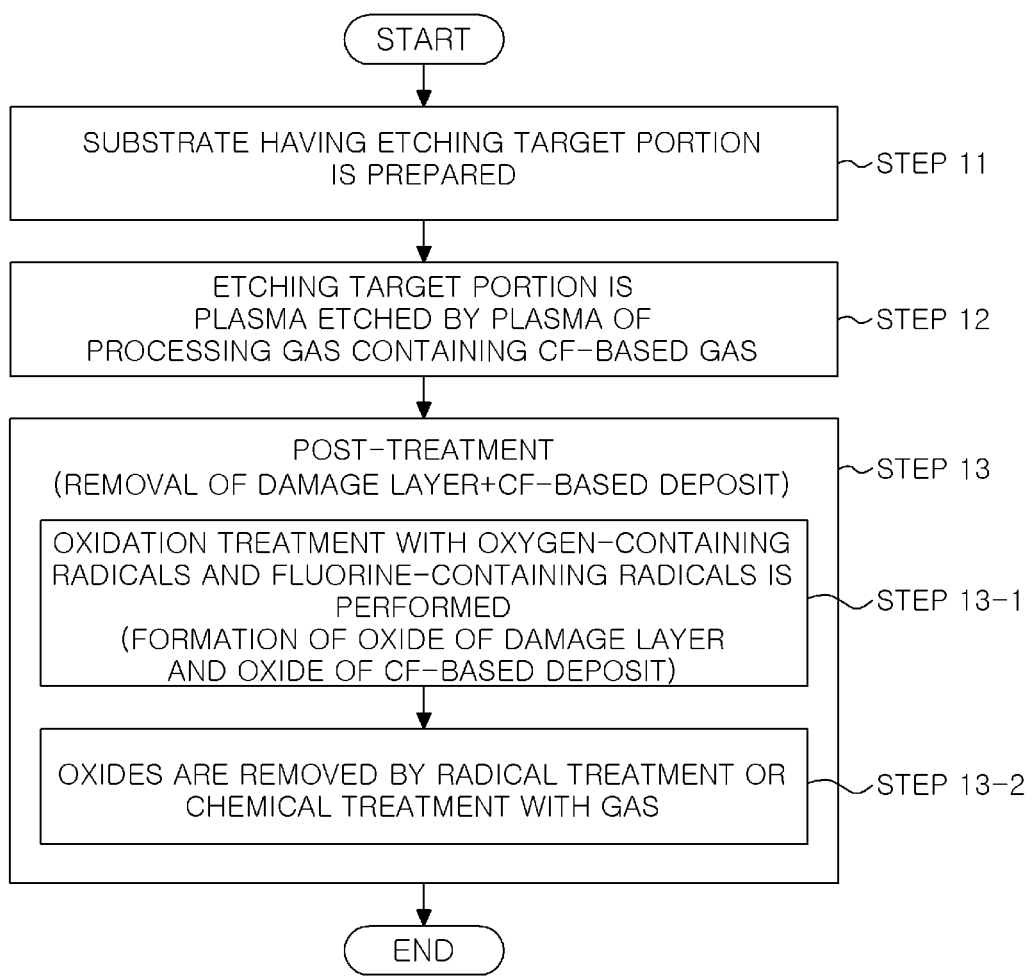
FIG. 3 is a flowchart showing an etching method according to a second embodiment.

Next, a second embodiment will be described in detail. FIG. 3 is a flowchart showing an etching method according to the second embodiment.

First, similar to step 1 of the first embodiment, a substrate having an etching target portion is prepared (step 11). As for the substrate, a semiconductor wafer represented by a silicon wafer (hereinafter simply referred to as "wafer") is exemplified, and a surface of the substrate may include a Si-containing portion such as Si or SiGe. A silicon oxide film ($SiO_2$ film) is exemplified as the etching target portion.

Next, similar to step 2 of the first embodiment, the etching target portion of the substrate is etched into a predetermined pattern by plasma of a processing gas containing a CF-based gas (step 12). A fine pattern is formed through the etching.

The fine pattern obtained through the plasma etching of the etching target portion has recesses such as trenches and holes, and, after the etching, a damage layer is formed at the bottom of each recess and a CF-based deposit (CF polymer) may further remain on a bottom surface and a side surface of each recess as an etching residue.

In the present embodiment, after the plasma etching, post-treatment is performed to remove the damage layer and the CF-based deposit remaining as the etching residue (step 13).

In the present embodiment, the post-treatment (step 13) is similar to the post-treatment (step 3) of the first embodiment and includes an oxidation treatment with oxygen-containing radicals and fluorine-containing radicals (step 13-1) and an oxide removal treatment performed by a radical treatment or a chemical treatment with a gas (step 13-2).

Figure 4A:
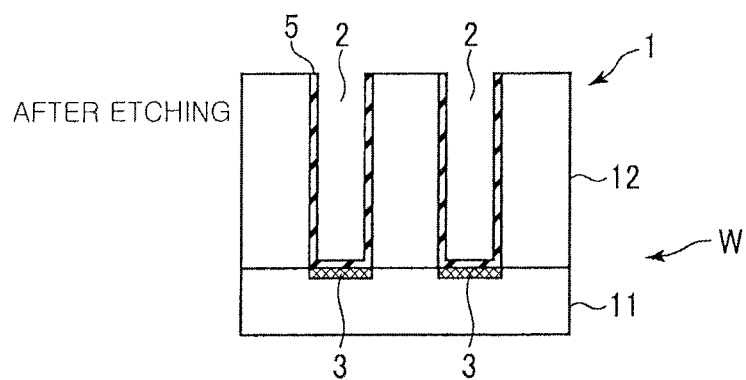
FIG. 4A is a schematic view showing a state of a wafer after a plasma etching is performed in the second embodiment.

In the present embodiment, as shown in FIG. 4A, when a pattern 1 having recesses 2 is formed by etching an oxide film 12 with plasma of a processing gas containing a CF-based gas, a CF-based deposit 5 is formed on an inner wall (a side surface and a bottom surface) of each recess 2 in addition to the formation of the damage layer 3.

Figure 4B:
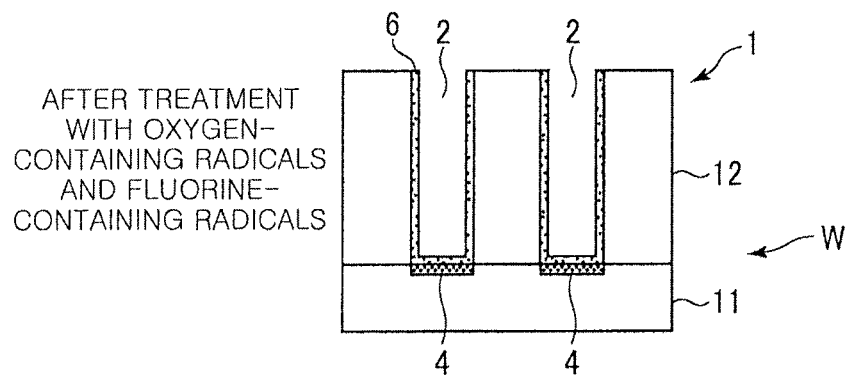
FIG. 4B is a schematic view showing a state of the wafer after a treatment with oxygen-containing radicals and fluorine-containing radicals is performed in the second embodiment.

Therefore, as shown in FIG. 4B, when the treatment with the oxygen-containing radicals and the fluorine-containing radicals is performed in step 13-1, the oxide 4 of the damage layer (the oxidized damage layer) is formed as in the first embodiment and an oxide 6 of the CF-based deposit (the oxidized CF-based deposit) is also formed by the action of the oxygen-containing radicals. Step 13-1 can be performed in the same manner as step 3-1 of the first embodiment.

Figure 4C:
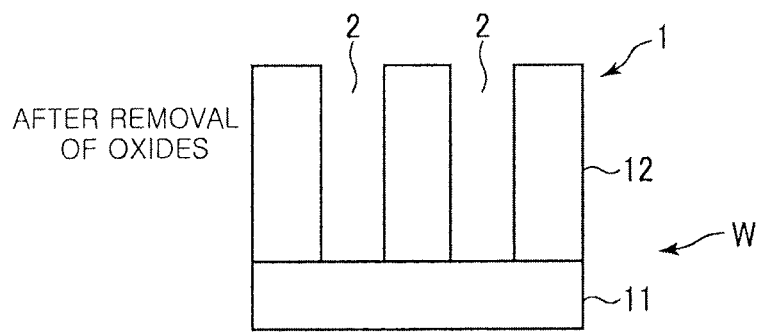
FIG. 4C is a schematic view showing a state of the wafer after an oxide removal treatment is performed in the second embodiment.

Then, as shown in FIG. 4C, the oxide removal treatment is performed in step 13-2, so that the oxide 4 and the oxide 6 can be removed. Step 13-2 can be performed in the same manner as step 3-2 of the first embodiment.

Figure 5A:
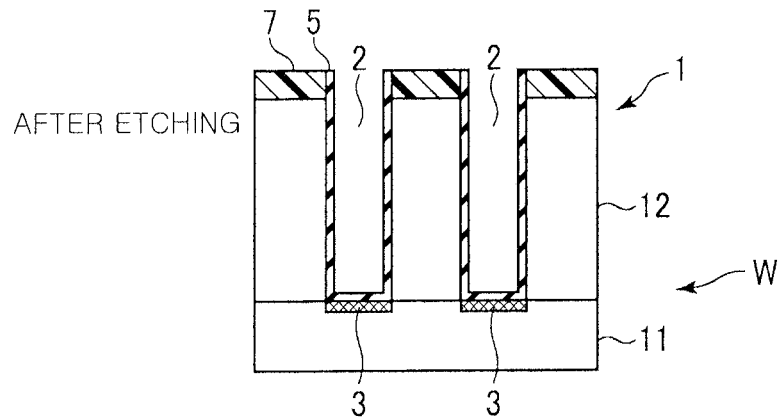
FIG. 5A is a schematic view showing a state in which a photoresist layer remains after the plasma etching is performed in the second embodiment.
Figure 5B:
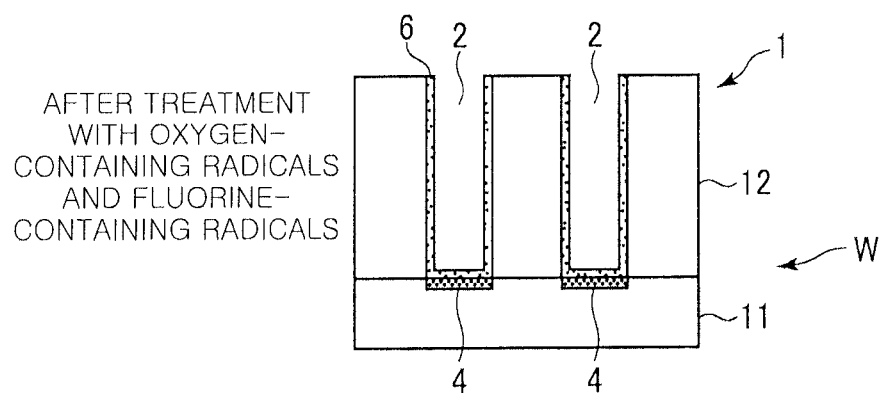
FIG. 5B is a schematic view showing a state in which the photoresist layer is removed when the treatment with the oxygen-containing radicals and the fluorine-containing radicals is performed on the wafer of FIG. 5A.
Figure 5C:
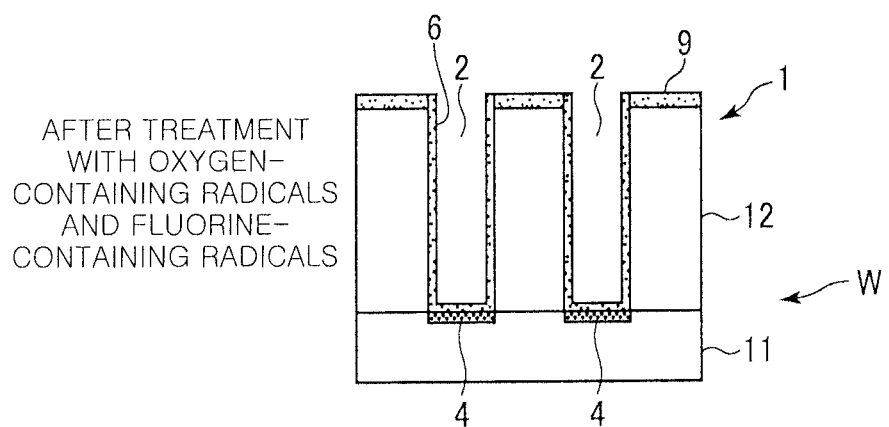
FIG. 5C is a schematic view showing a state in which a part of the photoresist layer remains in an oxidized state when the treatment with the oxygen-containing radicals and the fluorine-containing radicals is performed on the wafer of FIG. 5A.

Meanwhile, after the plasma etching, a photoresist layer 7 may remain as shown in FIG. 5A. However, since step 13-1 is a treatment performed mainly with the oxygen-containing radicals, it is possible to provide an ashing function. Thus, as shown in FIG. 5B, the photoresist layer 7 can be removed by the ashing. Further, as shown in FIG. 5C, even when the photoresist layer 7 is not completely removed, the residue is oxidized into an oxide 9 by the oxygen-containing radicals and the oxide 9 can be removed by performing the oxide removal treatment of step 13-2.

Third Embodiment

Figure 6:
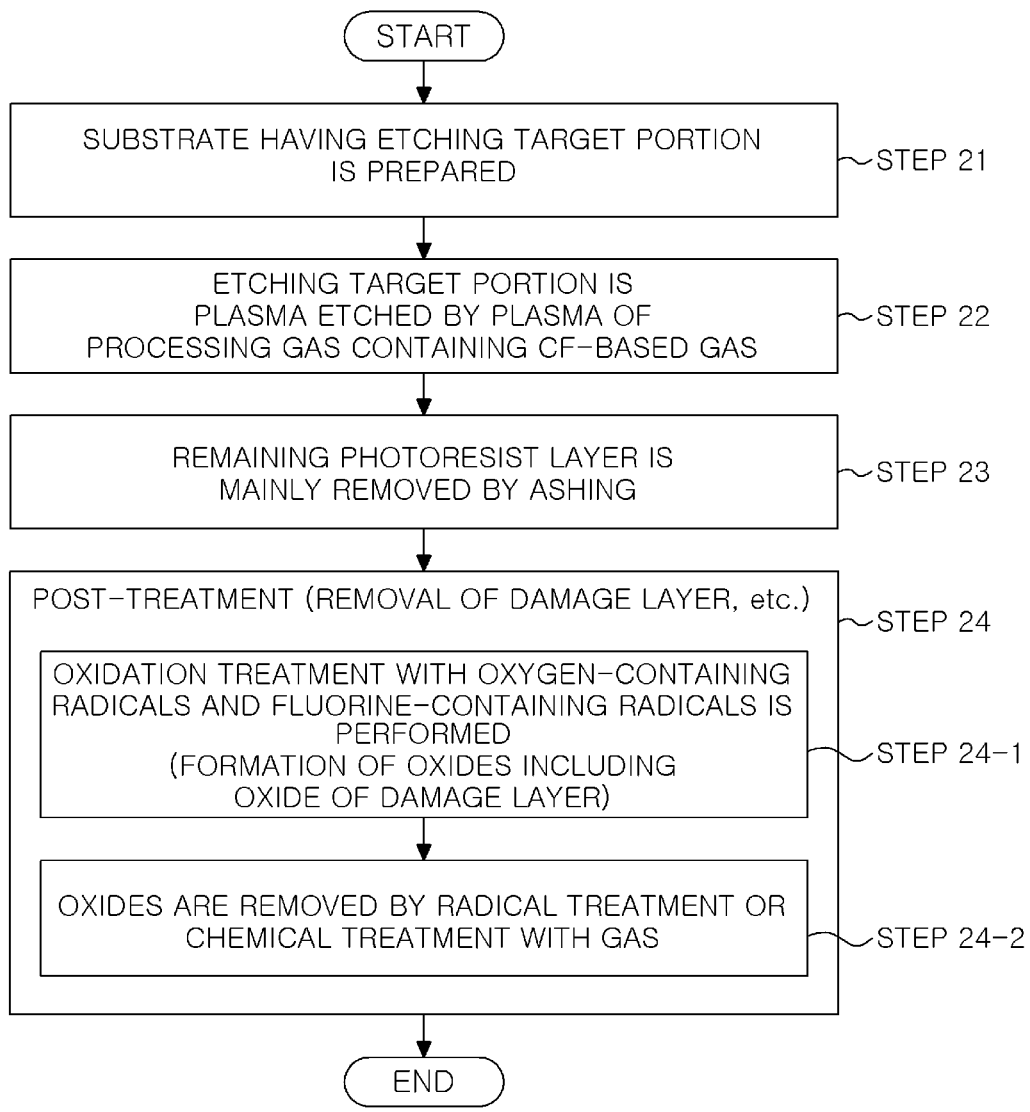
FIG. 6 is a flowchart showing an etching method according to a third embodiment.

Next, a third embodiment will be described in detail. FIG. 6 is a flowchart showing an etching method according to the third embodiment.

First, similar to step 1 of the first embodiment, a substrate having an etching target portion is prepared (step 21). As for the substrate, a semiconductor wafer represented by a silicon wafer (hereinafter simply referred to as "wafer") is exemplified, and a surface of the substrate may include a Si-containing portion such as Si or SiGe. A silicon oxide film ($SiO_2$ film) is exemplified as the etching target portion.

The etching target portion of the substrate is etched into a predetermined pattern by plasma of a processing gas containing a CF-based gas (step 22). A fine pattern having, e.g., recesses is formed through the etching. A Si-containing portion such as Si or SiGe is exposed at the bottom of each recess formed during the etching, and C and F are implanted into the exposed Si-containing portion, thereby forming a damage layer. In addition, a CF-based deposit (CF polymer) is generated in each recess. Furthermore, when a photoresist layer is used as an etching mask, the photoresist layer and the like remain after the etching.

Next, the remaining photoresist layer is mainly removed by ashing (step 23). However, the damage layer formed during the etching can hardly be removed with the ashing. The CF-based deposit (CF polymer) may be removed to some extent, but a part of the CF-based deposit may remain as a residue. Further, the photoresist layer may not be completely removed after the ashing and may remain as an ashing residue.

Therefore, after the ashing in step 23, a post-treatment for removing the damage layer and the like is performed (step 24).

In the post-treatment of step 24, similar to the post-treatments of the first embodiment and the second embodiment, first, an oxidation treatment with oxygen-containing radicals and fluorine-containing radicals is performed (step 24-1). As a result, oxides including the oxide of the damage layer are formed. Then, the formed oxides are removed by a radical treatment or a chemical treatment with a gas (step 24-2).

Figure 7A:
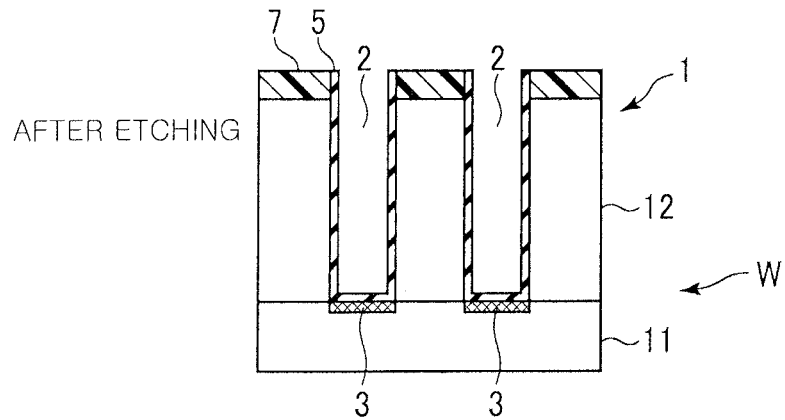
FIG. 7A is a schematic view showing a state of a wafer after a plasma etching is performed in the third embodiment.

Specifically, in the present embodiment, as shown in FIG. 7A, when the recesses 2 are formed by etching the oxide film 12 with the plasma of the processing gas containing the CF-based gas, the damage layer 3 is formed on the Si-containing portion of the surface of the substrate 11 exposed at the bottom of each recess 2 and the CF-based deposit 5 is formed on an inner wall (a side surface and a bottom surface) of each recess 2. Moreover, a part of the photoresist layer 7 used as the etching mask remains as the residue.

Figure 7B:
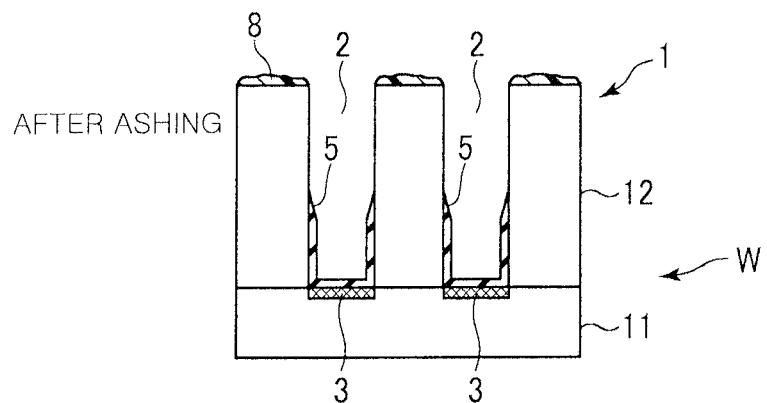
FIG. 7B is a schematic view showing a state of the wafer after ashing is performed in the third embodiment.

Therefore, in the present embodiment, the photoresist layer 7 is mainly removed by the ashing in step 23. As for the ashing, a conventional ashing can be performed. For example, the ashing may be performed by supplying an excited oxygen-containing gas such as oxygen plasma or ozone. However, as shown in FIG. 7B, the damage layer 3 remains without being removed by the ashing. Further, a part of the CF-based deposit 5 also remains, and an ashing residue 8 that is a photoresist layer that are not completely removed by the ashing may also remain.

Figure 7C:
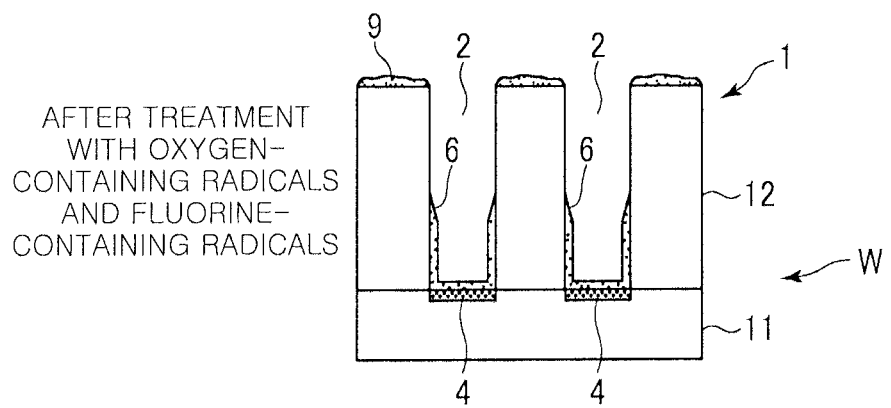
FIG. 7C is a schematic view showing a state of the wafer after a treatment with oxygen-containing radicals and fluorine-containing radicals is performed in the third embodiment.

Therefore, in the present embodiment, after the ashing in step 23, the oxidation treatment with the oxygen-containing radicals and the fluorine-containing radicals is first performed in step 24-1. Then, as shown in FIG. 7C, the remaining damage layer 3 and the remaining CF-based deposit 5 can be modified into the oxide 4 and the oxide 6. Further, the ashing residue 8 generated in the ashing of step 23 can also be oxidized into the oxide 9 in step 24-1. Step 24-1 can be performed in the same manner as step 3-1 of the first embodiment.

Figure 7D:
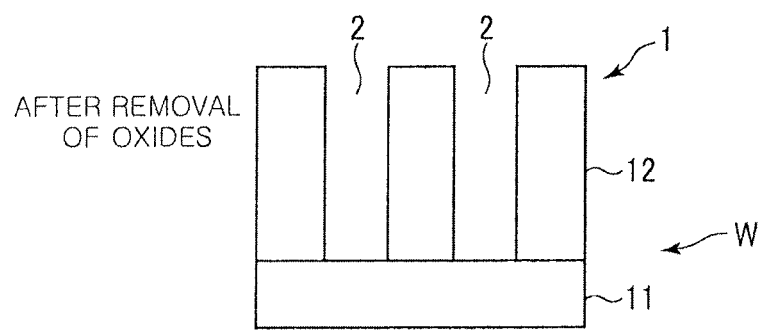
FIG. 7D is a schematic view showing a state of the wafer after an oxide removal treatment is performed in the third embodiment.

Then, in the post-treatment of step 24, the oxide 4 and the oxide 6 are removed as shown in FIG. 7D by the oxide removal treatment performed by the radical treatment or the chemical treatment with the gas in step 24-2. Further, even when the oxide 9 of the ashing residue (the oxidized ashing residue) is present, the oxide 9 can be removed by the treatment of step 24-2. Step 24-2 can be performed in the same manner as step 3-2 of the first embodiment.

As described above, even if the damage layer and the CF-based deposit remain after the ashing is performed, the oxidation treatment of step 24-1 and the oxide removal treatment of step 24-2 are performed as the post-treatment (step 24). Thus, the damage layer and the CF-based deposit can be sufficiently removed. In addition, even when a part of the photoresist layer remains as an ashing residue after the ashing is performed, this residue is oxidized into the oxide by the oxidation treatment of step 24-1 and the oxide can be removed by the oxide removal treatment of step 24-2.

Fourth Embodiment

Figure 8:
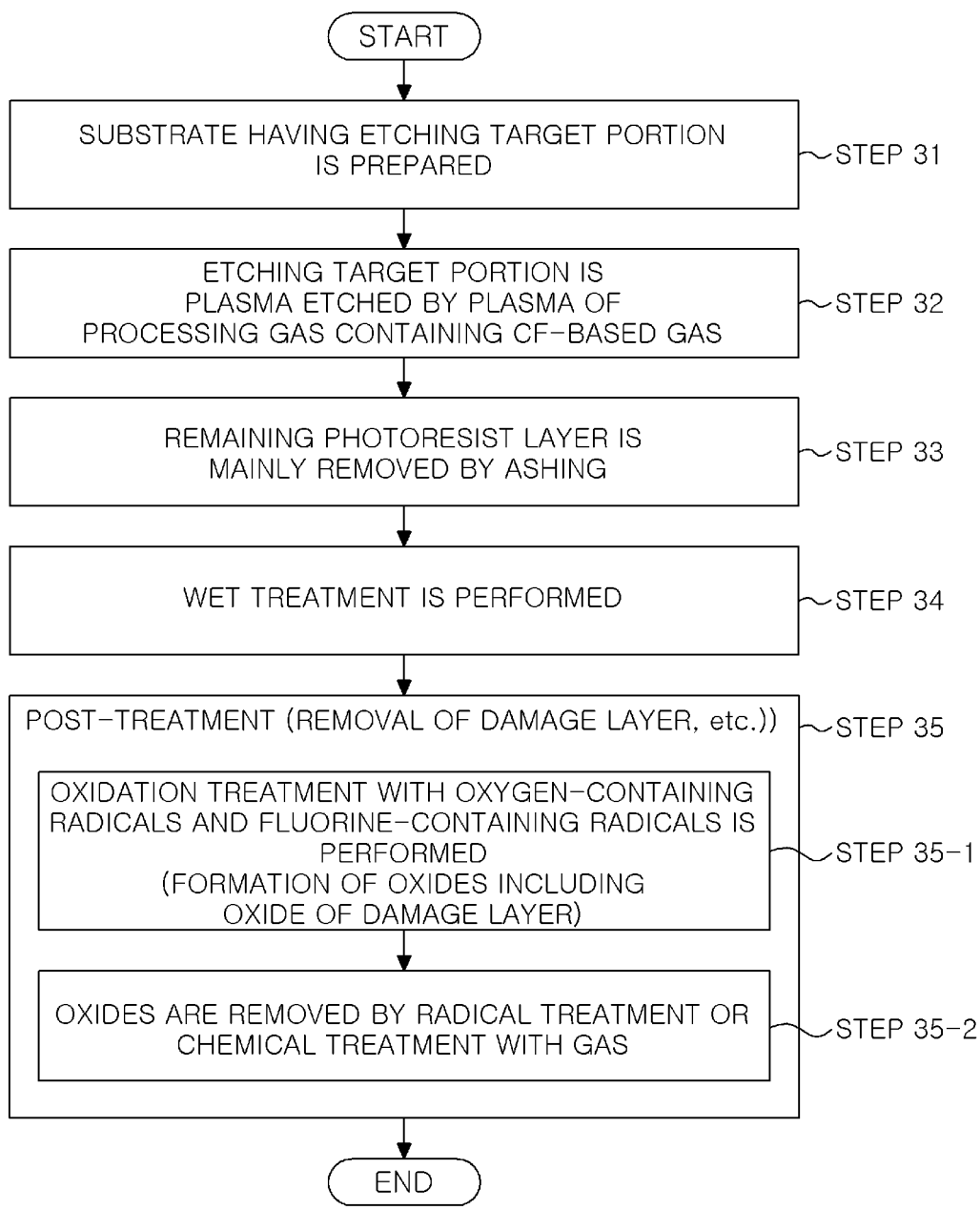
FIG. 8 is a flowchart showing an etching method according to a fourth embodiment.

Next, a fourth embodiment will be described in detail. FIG. 8 is a flowchart showing an etching method according to the fourth embodiment.

First, similar to step 1 of the first embodiment, a substrate having an etching target portion is prepared (step 31). As for the substrate, a semiconductor wafer represented by a silicon wafer (hereinafter simply referred to as "wafer") is exemplified, and a surface of the substrate may include a Si-containing portion such as Si or SiGe. A silicon oxide film (SiO$_2$ film) is exemplified as the etching target portion.

The etching target portion of the substrate is etched into a predetermined pattern by plasma of a processing gas containing a CF-based gas (step 32). A fine pattern having, e.g., recesses is formed through the etching. A Si-containing portion such as Si or SiGe is exposed at the bottom of each recess formed during the etching, and C and F are implanted into the exposed Si-containing portion, thereby forming a damage layer.

Next, a remaining photoresist layer is mainly removed by ashing (step 33). Although the photoresist layer can be removed by the ashing as described in the third embodiment, the damage layer formed during the etching can hardly be removed. A CF-based deposit (CF polymer) may be removed to some extent, but a part of the CF-based deposit may remain as a residue. Further, the photoresist layer may not be completely removed after the ashing and may remain as an ashing residue.

Next, a wet treatment is performed (step 34). As a result, the remaining damage layer, the remaining CF-based deposit, and the ashing residue can be removed.

However, the damage layer formed on the Si-containing portion exposed at the bottom of each recess is not sufficiently removed even by the wet treatment. In addition, the CF-based deposit (CF polymer) may slightly remain.

Therefore, after the wet treatment of step 34, a post-treatment for removing the damage layer and the like is performed (step 35).

In the post-treatment of step 35, as in the first to third embodiments, first, an oxidation treatment with oxygen-containing radicals and fluorine-containing radicals is performed (step 35-1). As a result, oxides including the oxide of the damage layer are formed. Then, the oxides including the oxide of the damage layer are removed by a radical treatment or a chemical treatment with a gas (step 35-2).

Specifically, in the present embodiment, as shown in FIG. 7A of the third embodiment, when a pattern 1 having recesses 2 is formed by etching the oxide film 12 with the plasma of the processing gas containing the CF-based gas, the damage layer 3 is formed on the Si-containing portion of the surface of the substrate 11 exposed at the bottom of each recess 2 and the CF-based deposit 5 is formed on an inner wall (a side surface and a bottom surface) of each recess 2. Moreover, a part of the photoresist layer 7 used as the etching mask remains as the residue.

Therefore, in step 33, the photoresist layer 7 is mainly removed by the ashing. After the ashing, as shown in FIG. 7B of the third embodiment, the damage layer 3 remains without being removed. Further, a part of the CF-based deposit 5 also remains, and an ashing residue 8 that is a photoresist layer that are not completely removed by the ashing may also remain.

Figure 9A:
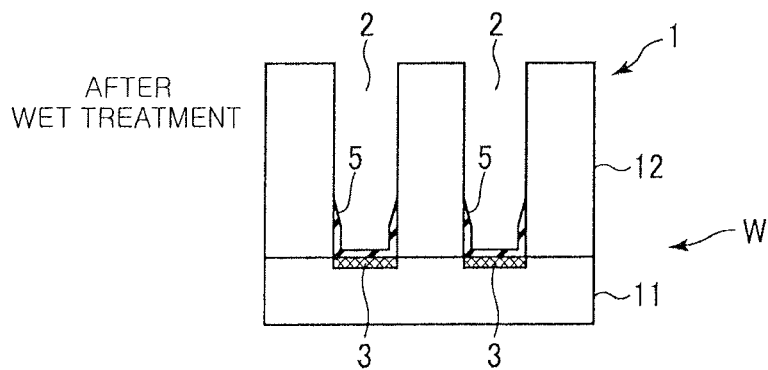
FIG. 9A is a schematic view showing a state of a wafer after a wet treatment is performed in the fourth embodiment.

In the present embodiment, the wet treatment of step 34 is then performed. The wet treatment is performed using, for example, an aqueous mixture of NH$_4$OH and H$_2$O$_2$ (SC-1 solution), an aqueous mixture of HCl and H$_2$O$_2$ (SC-2 solution), an aqueous solution of H$_2$O$_2$, an aqueous mixture of H$_2$SO$_4$ and H$_2$O$_2$ (SPM solution), and a chemical solution such as DHF. The wet treatment removes the residues after the ashing. However, as shown in FIG. 9A, although the ashing residues can be almost removed by performing the wet treatment after the ashing, the damage layer 3 is not sufficiently removed and the CF-based deposit 5 also slightly remains.

Figure 9B:
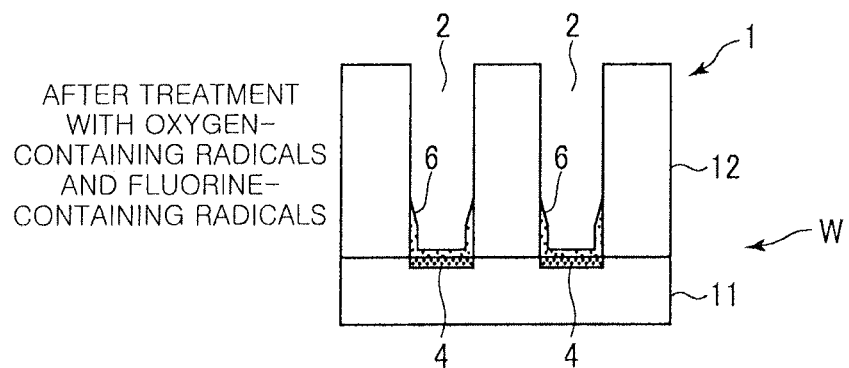
FIG. 9B is a schematic view showing a state of the wafer after a treatment with oxygen-containing radicals and fluorine-containing radicals is performed in the fourth embodiment.

Therefore, in the present embodiment, after the wet etching of step 34, the oxidation treatment with the oxygen-containing radicals and the fluorine-containing radicals in step 35-1 is first performed as the post-treatment 35. Then, as shown in FIG. 9B, the remaining damage layer 3 and the remaining CF-based deposit 5 can be modified into the oxide (the oxidized damage layer) 4 and the oxide (the oxidized CF-based deposit) 6. Step 35-1 can be performed in the same manner as step 3-1 of the first embodiment.

Figure 9C:
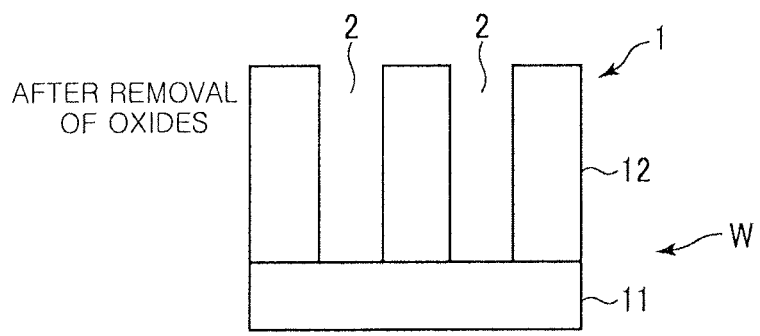
FIG. 9C is a schematic view showing a state of the wafer after an oxide removal treatment is performed in the fourth embodiment.

Then, in the post-treatment of step 35, the oxide 4 and the oxide 6 are removed as shown in FIG. 9C by the oxide removal treatment performed by the radical treatment or the chemical treatment with the gas in step 35-2. Step 35-2 can be performed in the same manner as step 3-2 of the first embodiment.

As described above, even if the damage layer remains after the wet treatment, the post-treatment of step 35 is performed by the oxidation treatment of step 35-1 and the oxide removal treatment of step 35-2. Thus, the damage layer can be sufficiently removed. Further, the CF-based deposit remaining after the wet treatment is also oxidized into the oxide by the oxidation treatment of step 35-1 and the oxide of the remaining CF-based deposit can be removed by the oxide removal treatment of step 35-2.

<Processing System>

Next, an example of a processing system used for the etching methods will be described.

<First Example of the Processing System>

Figure 10:
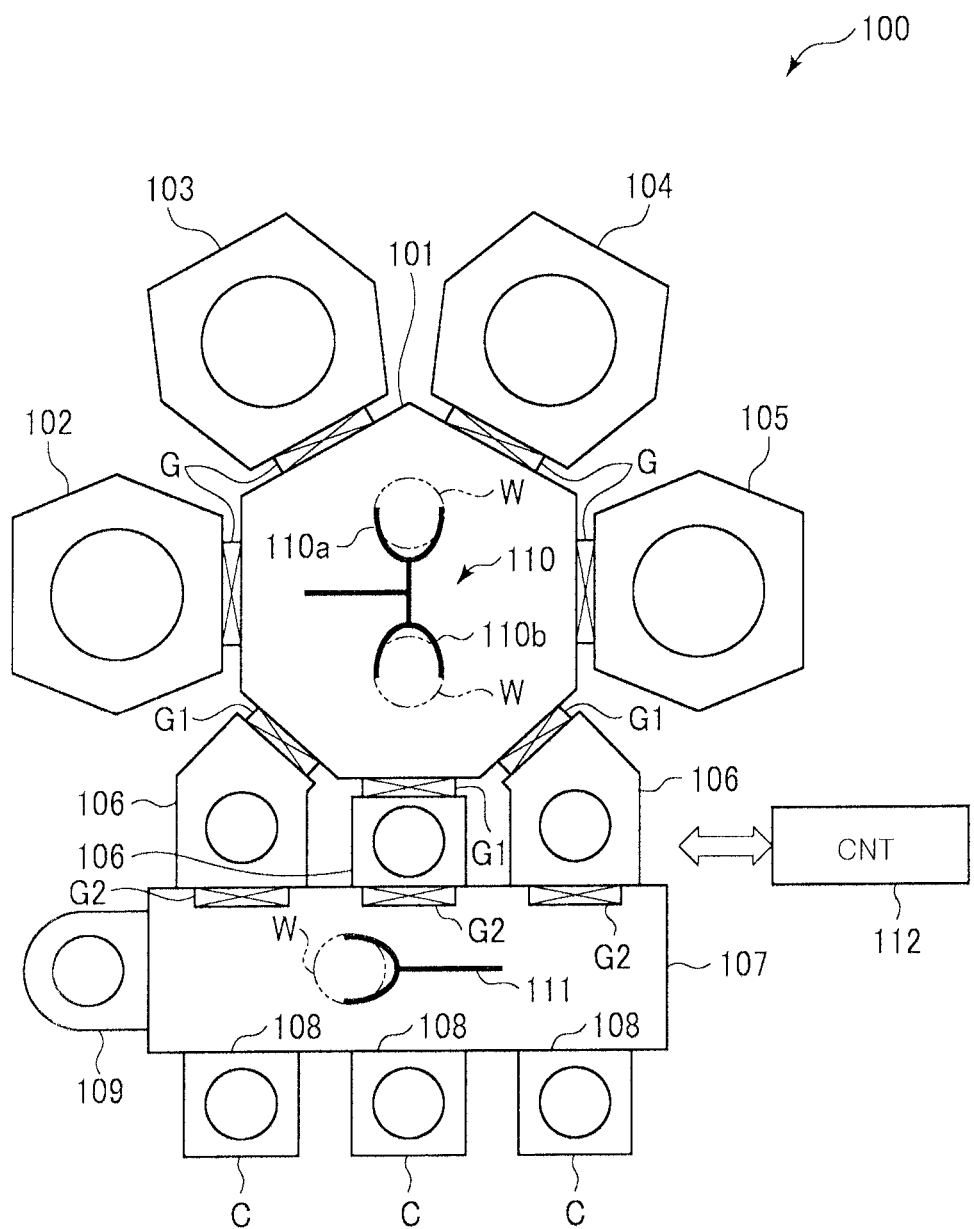
FIG. 10 is a horizontal cross-sectional view schematically showing a first example of a processing system used in the etching methods of the first and second embodiments.

FIG. 10 is a horizontal cross-sectional view schematically showing a first example of a processing system used in the etching methods of the first and second embodiments.

As shown in FIG. 10, the processing system 100 of the first example includes a vacuum transfer chamber 101. The vacuum transfer chamber 101 has seven walls, each having a connection port. A plasma etching apparatus 102, an oxidation treatment apparatus 103, an oxide removal apparatus 104, and a heating apparatus 105 are connected to four walls of the vacuum transfer chamber 101 as processing apparatuses through gate valves G, respectively. The inside of the vacuum transfer chamber 101 is exhausted by a vacuum pump and maintained at a predetermined vacuum level.

Further, three load lock chambers 106 are connected to the other three walls of the vacuum transfer chamber 101 through gate valves G1, respectively. Each load lock chamber 106 is configured to control the pressure between the atmospheric pressure and a vacuum level when the wafer W that is a target substrate is transferred between an atmospheric transfer chamber 107 and the vacuum transfer chamber 101. The atmospheric transfer chamber 107 is connected to the load lock chambers 106 on the side away from the vacuum transfer chamber 101. The three load lock chambers 106 are connected to the atmospheric transfer chamber 107 via gate valves G2.

Three carrier mounting ports 108 are connected to the atmospheric transfer chamber 107 on the side away from the load lock chambers 106, and each of the three carrier mounting ports 108 is provided for mounting a carrier (e.g., FOUP) C accommodating a wafer W having an etching target portion. An alignment chamber 109 for aligning the silicon wafer W is provided at one short side of the atmospheric transfer chamber 107. A downflow of clean air is formed in the atmospheric transfer chamber 107.

A wafer transfer mechanism 110 is provided in the vacuum transfer chamber 101. The wafer transfer mechanism 110 is configured to transfer the wafer W to the plasma etching apparatus 102, the oxidation treatment apparatus 103, the oxide removal apparatus 104, the heating apparatus 105, and the load lock chambers 106. The wafer transfer mechanism 110 includes two individually movable transfer arms 110a and 110b.

A wafer transfer mechanism 111 is provided in the atmosphere transfer chamber 107. The wafer transfer mechanism 111 is configured to transfer the silicon wafer W to the carriers C, the load lock chambers 106, and the alignment chamber 109.

The processing system 100 includes a general controller (CNT) 112. The general controller 112 includes a main controller having a CPU for controlling the operations of individual components of the processing system 100 including each processing apparatus, the vacuum transfer chamber, the load lock chambers, and the like. The general controller 112 further includes an input device, an output device, a display device, and a storage device (storage medium). For example, the main controller allows the individual components of the processing system 100 to execute predetermined operations to perform the etching methods described above based on processing recipes stored in the storage medium set in the storage device or the storage medium installed in the storage device.

In the processing system 100 configured as described above, first, the wafer W is extracted from one of the carriers C connected to the atmosphere transfer chamber 107 by the wafer transfer mechanism 111, passes through the alignment chamber 109, and then is loaded into one of the load lock chambers 106 by opening the gate valve G2. After the gate valve G2 is closed, the load lock chamber 106 is vacuum-evacuated. Then, the gate valve G1 is open when the load lock chamber 106 reaches a predetermined vacuum level, and the wafer is unloaded from the load lock chamber 106 by one of the transfer arms 110a and 110b of the wafer transfer mechanism 110.

Then, the wafer W held by the transfer arm is loaded into the plasma etching apparatus 102, and the plasma etching of an etching target portion of the wafer W is performed with a processing gas containing a CF-based gas in the plasma etching apparatus 102.

Next, the plasma-etched wafer W is unloaded from the plasma etching apparatus 102 by the transfer arm and loaded into the oxidation treatment apparatus 103. Then, in the oxidation treatment apparatus 103, an oxidation treatment with oxygen-containing radicals and fluorine-containing radicals is carried out, and an oxide of the damage layer is mainly formed.

Next, the oxidation-treated wafer W is unloaded from the oxidation treatment apparatus 103 by the transfer arm and loaded into the oxide removal apparatus 104. Then, oxides including the oxide of the damage layer are removed by the oxide removal apparatus 104.

In a case where the oxide removal treatment is the COR treatment using the HF gas and the $NH_3$ gas, an ammonium fluoride-based compound is produced after the treatment. Thus, the wafer W processed in the oxide removal apparatus 104 is loaded into the heating apparatus 105 and heated to remove the reaction product.

After the plasma etching treatment, the oxidation treatment, and the oxide removal treatment are performed as described above, the processed wafer W is transferred to one of the load lock chambers 106 by the transfer arm. Then, the inside of the load lock chamber 106 is returned to the atmosphere, and the wafer W in the load lock chamber 106 is returned to the carrier C by the wafer transfer mechanism 111.

The above-described process is simultaneously performed in a parallel manner for a plurality of wafers W, and the etching process of a predetermined number of wafers W is completed.

(Plasma Etching Apparatus)

The plasma etching apparatus 102 installed in the processing system 100 may be any apparatus that can perform general plasma etching, and examples thereof include a capacitively coupled parallel plate type plasma etching apparatus and a microwave plasma etching apparatus. At the time of plasma etching, a processing gas containing a CF-based gas is ionized, and an etching target portion such as an oxide film is anisotropically etched by the ions.

(Oxidation Treatment Apparatus)

Next, an example of the oxidation treatment apparatus 103 installed in the processing system will be described.

Figure 11:
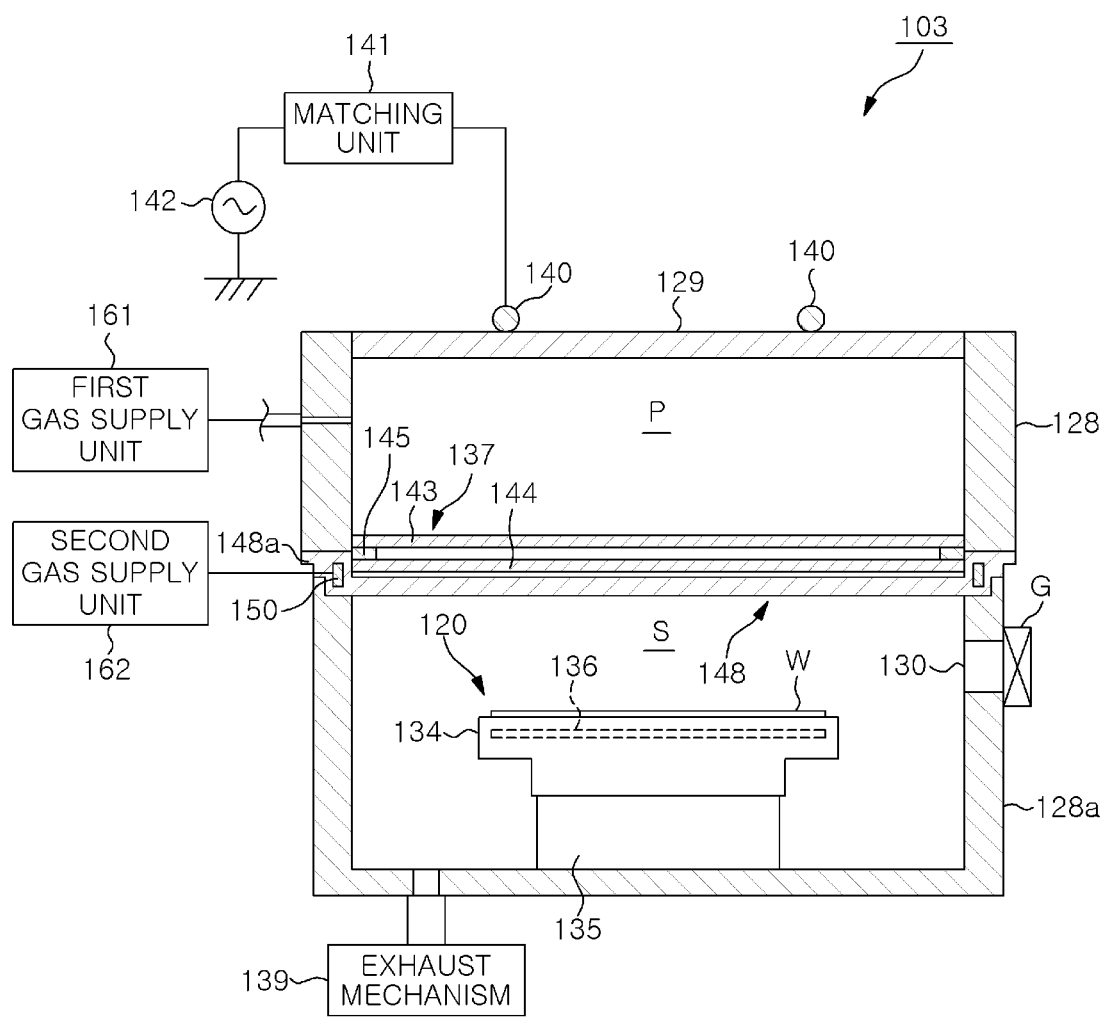
FIG. 11 is a cross-sectional view schematically showing an example of an oxidation treatment apparatus installed in the processing system shown in FIG. 10.

FIG. 11 is a cross-sectional view showing an example of the oxidation treatment apparatus. As shown in FIG. 11, the oxidation treatment apparatus 103 includes a hermetically sealed processing chamber 128 for accommodating the wafer W therein. The processing chamber 128 is made of, for example, aluminum or an aluminum alloy. The processing chamber 128 has an open upper end, and the upper end of the processing chamber 128 is closed by a lid 129 serving as a ceiling. A loading/unloading port 130 for loading and unloading the wafer W to and from the vacuum transfer chamber 101 is provided at a sidewall 128a of the processing chamber 128. The loading/unloading port 130 can be open and closed by the gate valve G described above.

In addition, a stage 120 for horizontally supporting the wafer W is disposed at a bottom inside of the processing chamber 128. The stage 120 has a substantially columnar shape. The stage 120 includes a mounting plate 134 on which the wafer W is directly mounted and a base block 135 that supports the mounting plate 134. A temperature controlling mechanism 136 configured to adjust the temperature of the wafer W is provided in the mounting plate 134. The temperature controlling mechanism 136 has, for example, a pipe (not shown) through which a temperature adjusting medium (e.g., water or Galden) circulates, so that the temperature of the wafer W is adjusted by heat exchange between the wafer W and the temperature adjusting medium flowing in the pipe. A plurality of lift pins (not shown) used when loading and unloading the wafer W into and from the processing chamber 128 are provided in the stage 120 so as to protrude beyond and retreat below an upper surface of the mounting plate 134.

The inside of the processing chamber 128 is partitioned by a partition plate 137 into an upper plasma generation space P and a lower processing space S. The partition plate 137 has a plate-shaped member 143 and a plate-shaped member 144 provided with slits that do not overlap each other when the partition plate 137 is viewed from the processing space S. A spacer 145 is disposed between the plate-shaped member 143 and the plate-shaped member 144. Therefore, the partition plate 137 serves as a so-called ion trap that suppresses inflow of ions in the plasma from the plasma generation space P to the processing space S when inductively coupled plasma is generated in the plasma generation space P. The plasma generation space P is a space in which plasma is generated, and the processing space S is a space in which the wafer W is subjected to radical etching. Provided outside the processing chamber 128 are a first gas supply unit 161 configured to supply a processing gas used for the oxidation treatment to the plasma generation space P and a second gas supply unit 162 configured to supply a gas that does not turn into plasma such as a pressure adjusting gas, a purge gas, or a dilution gas, an inert gas such as $N_2$ gas or Ar gas, and the like to the processing space S. An exhaust mechanism 139 is connected to the bottom of the processing chamber 128. The exhaust mechanism 139 has a vacuum pump, so that the processing space S can be evacuated to vacuum.

Further, a heat shield plate 148 is provided under the partition plate 137 so as to face the wafer W. The heat shield plate 148 is provided to suppress the heat accumulated in the partition plate 137 by repeating the plasma generation in the plasma generation space P from affecting the radical distribution in the processing space S. The heat shield plate 148 is formed to be larger than the plate-shaped member 144 of the partition plate 137, and a flange portion 148a forming a peripheral portion of the heat shield plate 148 is embedded in the sidewall 128a of the processing chamber 128. Further, in the flange portion 148a, a cooling mechanism 150, for example, a coolant channel and a chiller or a Peltier element are embedded.

The first gas supply unit 161 supplies an oxygen-containing gas such as $O_2$ gas or a fluorine-containing gas such as $NF_3$ gas, $SF_6$ gas, or $F_2$ gas to the plasma generation space P. In addition, other gases, for example, $H_2$ gas and a noble gas such as Ar gas, are supplied to the plasma generation space P. These gases are turned into plasma in the plasma generation space P. Further, the rare gas also serves as the pressure adjusting gas, the purge gas, or the like as well as serves as a plasma generation gas.

Further, the oxidation treatment apparatus 103 is configured as an inductively coupled plasma etching apparatus using an RF antenna. The lid 129 that serves as the ceiling of the processing chamber 128 is formed of, for example, a circular quartz plate, and is configured as a dielectric window. An annular RF antenna 140 for generating inductively coupled plasma in the plasma generation space P of the processing chamber 128 is disposed on the lid 129, and the RF antenna 140 is connected to a radio frequency power supply 142 via a matching unit 141. The radio frequency power supply 142 is configured to output, at a predetermined output value, a radio frequency power having a predetermined frequency (for example, 13.56 MHz or more) suitable for generating plasma by inductively coupled radio frequency discharge. The matching unit 141 has a reactance variable matching circuit (not shown) for matching an impedance of the radio frequency power supply 142 side and an impedance of a load (RF antenna 140 or plasma) side.

In the oxidation treatment apparatus 103 configured as described above, the wafer W is loaded into the processing chamber 128 and placed on the stage 120.

Next, for example, $N_2$ gas serving as a pressure adjusting gas is introduced into the processing chamber 128 from the second gas supply unit 162, and the wafer W is placed on the stage 120 for a predetermined time period while adjusting the pressure in a state where the temperature of the stage 120 is adjusted to be in a range of 0.1 to 120° C. by the temperature controlling mechanism 136 to stabilize the wafer temperature to a predetermined temperature.

Next, after purging the inside of the processing chamber 128, the pressure in the processing chamber 128 is preferably set to be in a range of 13.3 to 266.6 Pa (100 to 2000 mTorr), more preferably in a range of 26.6 to 133.3 Pa (200 to 1000 mTorr). Further, the temperature of the stage 120 is preferably set to be in a range of 15 to 100° C.

In the oxidation treatment, $O_2$ gas as the oxygen-containing gas and $NF_3$ gas as the fluorine-containing gas are supplied from the first gas supply unit 161 to the plasma generation space P, and a radio frequency power is supplied to the RF antenna 140 to generate plasma containing oxygen and fluorine that is the inductively coupled plasma. Here, the fluorine-containing gas may be $SF_6$ gas, $F_2$ gas, or the like. Further, in addition to the $O_2$ gas and the $NF_3$ gas, at least one kind of noble gases such as $H_2$ gas and Ar gas may be supplied. A gas flow rate at this time is preferably set such that an $O_2$ gas flow rate is in a range of 100 to 2500 sccm and $NF_3$ gas flow rate is in a range of 1 to 20 sccm, for example. Further, the volume ratio (flow rate ratio) of the $NF_3$ gas to the $O_2$ gas ($NF_3/O_2$) is 1% (1% by volume (vol %)) or less. Further, the plasma generation power is preferably in a range of 100 to 1000 W. The processing time may be in a range of, for example, 30 to 180 seconds.

The plasma containing oxygen and fluorine generated in the plasma generation space P is transferred to the processing space S. At this time, the ions are deactivated in the partition plate 137, and O radicals, $O_2$ radicals, and F radicals in the plasma are mainly and selectively introduced into the processing space S. Accordingly, the surface of a damage layer formed at the bottom of the recess is etched by the F radicals while the damage layer is oxidized by the O radicals and the $O_2$ radicals, thereby forming an oxide of the damage layer. Further, when a CF-based deposit is formed on an inner wall of the recesses of the pattern, an oxide of the CF-based deposit is also formed.

Since the oxidation treatment apparatus 103 performs the treatment performed mainly with the oxygen-containing radicals, the oxidation treatment apparatus 103 also provides an ashing function. Thus, when a photoresist layer remains after the plasma etching is performed, the photoresist layer can be removed by the ashing. Even when the photoresist layer cannot be completely removed, the residue thereof can be removed by the oxide removal treatment in which this residue is oxidized by the oxygen-containing radicals.

(Oxide Removal Apparatus)

Next, an example of the oxide removal apparatus 104 installed in the processing system 100 will be described. In this example, an apparatus that performs the COR treatment as the oxide removal treatment will be described.

Figure 12:
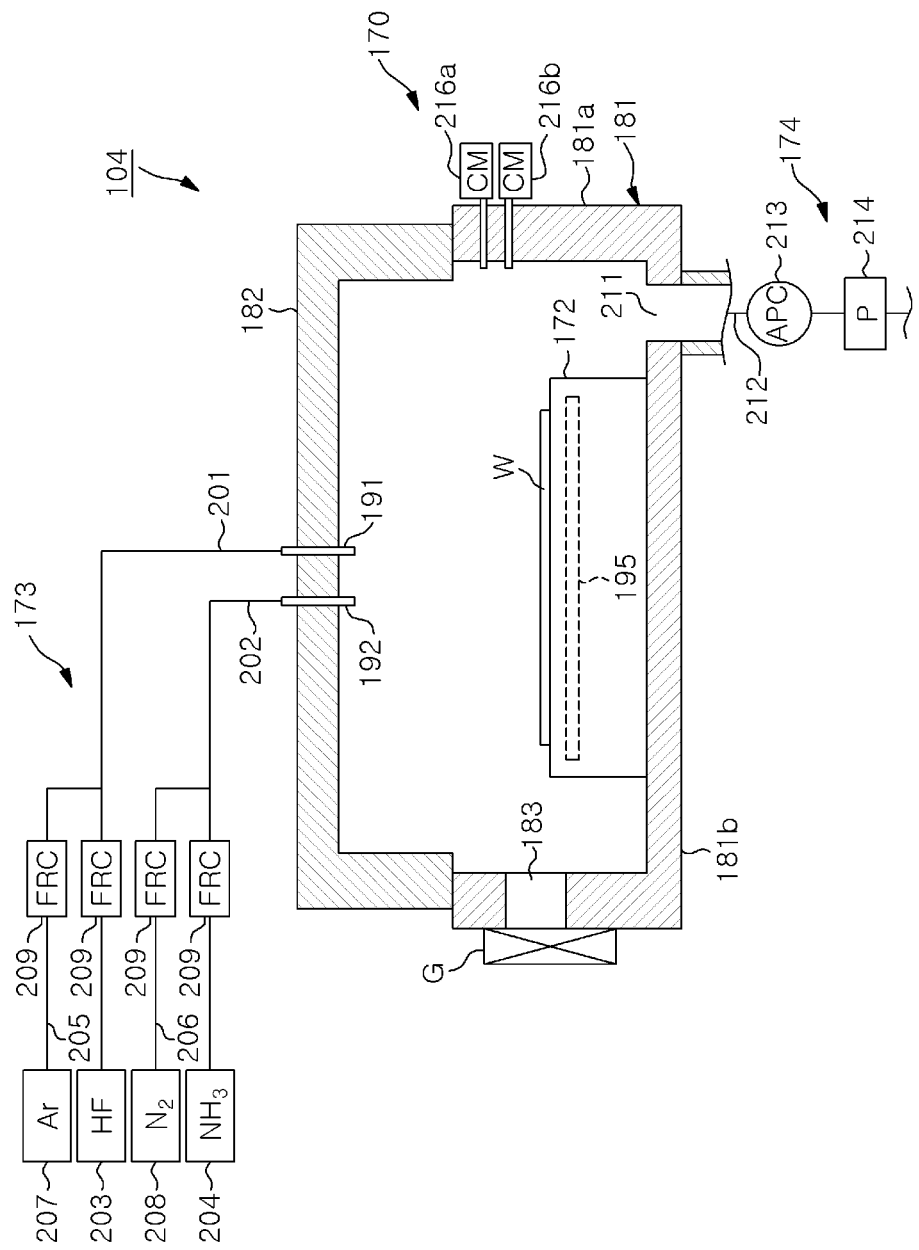
FIG. 12 is a cross-sectional view schematically showing an example of an oxide removal apparatus installed in the processing system shown in FIG. 10.

FIG. 12 is a cross-sectional view showing a COR apparatus as an example of the oxide removal apparatus. As shown in FIG. 12, the oxide removal apparatus 104 includes a hermetically sealed chamber 170 that serves as a processing container that defines a processing space. A substrate support 172 for horizontally supporting the wafer W is disposed in the chamber 170. Further, the oxide removal apparatus 104 includes a gas supply unit 173 configured to supply an etching gas into the chamber 170 and an exhaust unit 174 configured to evacuate the processing space of the chamber 170 to vacuum.

The chamber 170 includes a chamber main body 181 and a lid 182. The chamber main body 181 has a substantially cylindrical sidewall 181a, a bottom wall 181b, and an open upper end. The upper end of the chamber main body 181 is closed by the lid 182. The sidewall 181a and the lid 182 are hermetically sealed by a seal member (not shown) to ensure the airtightness of the chamber 170. A first gas introduction nozzle 191 and a second gas introduction nozzle 192 are inserted into the chamber 170 at the top wall of the lid 182.

A loading/unloading port 183 for loading and unloading the wafer W to and from the vacuum transfer chamber 101 is provided at the sidewall 181a, and the loading/unloading port 183 can be opened and closed by the gate valve G.

The substrate support 172 has a substantially circular shape in a plan view and is fixed to the bottom wall 181b of the chamber 170. A temperature controller 195 configured to adjust the temperature of the substrate support 172 is provided in the substrate support 172. The temperature controller 195 has, for example, a pipe through which a temperature adjusting medium (for example, water) circulates. The temperature of the substrate support 172 is adjusted by exchanging heat with the temperature adjusting medium flowing in the pipe, and thus the temperature control for the wafer W on the substrate support 172 can be performed.

The gas supply unit 173 includes a first gas supply pipe 201 and a second gas supply pipe 202 respectively connected to the first gas introduction nozzle 191 and the second gas introduction nozzle 192. The gas supply unit 173 further includes an HF gas supply source 203 and an $NH_3$ gas supply source 204 that are respectively connected to the first gas supply pipe 201 and the second gas supply pipe 202. Further, a third gas supply pipe 205 is connected to the first gas supply pipe 201, and a fourth gas supply pipe 206 is connected to the second gas supply pipe 202. An Ar gas supply source 207 and an $N_2$ gas supply source 208 are respectively connected to the third gas supply pipe 205 and the fourth gas supply pipe 206. Each of the first to fourth gas supply pipes 201, 202, 205 and 206 is provided with a flow rate control unit (FRC) 209 that is configured to open and close a flow path thereof and perform a flow rate control. The flow rate control unit 209 includes, for example, an on/off valve and a flow rate controller such as a mass flow controller.

Then, the HF gas and the Ar gas are supplied into the chamber 170 through the first gas supply pipe 201 and the first gas introduction nozzle 191, and the $NH_3$ gas and the $N_2$ gas are supplied into the chamber 170 through the second gas supply pipe 202 and the second gas instruction nozzle 192.

Among the above gases, the HF gas and the $NH_3$ gas are reaction gases, and these gases are supplied into the chamber 170 separately from the first gas introduction nozzle 191 and the second gas introduction nozzle 192 and then are mixed in the chamber 170 for the first time. The Ar gas and the $N_2$ gas are dilution gases. The HF gas and the $NH_3$ gas that are the reaction gases and the Ar gas and the $N_2$ gas that are dilution gases are introduced into the chamber 170, and the HF gas and the $NH_3$ gas react with oxides including an oxide of a damage layer formed on the wall of the recesses of the pattern to thereby produce an ammonium fluoride-based compound as a reaction product. As for the dilution gas, Ar gas or $N_2$ gas may be used alone. Alternatively, other inert gas may be used, or two or more of Ar gas, $N_2$ gas and other inert gas may be used.

Meanwhile, a shower plate may be provided at an upper portion of the chamber 170, and the excited gas may be supplied in a shower-like manner through the shower plate.

The exhaust unit 174 has an exhaust pipe 212 connected to an exhaust port 211 formed at the bottom wall 181b of the chamber 170. The exhaust unit 174 further includes an automatic pressure control (APC) valve 213 provided in the exhaust pipe 212 for controlling the pressure in the chamber 170 and a vacuum pump 214 for evacuating the inside of the chamber 170 to vacuum.

At the sidewall of the chamber 170, two capacitance manometers (CM) 216a and 216b for high pressure and low pressure, respectively, are inserted into the chamber 111. The two capacitance manometers 215a and 216b are pressure gauges for measuring the pressure inside the chamber 170. Further, a temperature sensor (not shown) is provided in the vicinity of the wafer W place on the substrate support 172.

In the oxide removal apparatus 104 configured as described above, the wafer W is loaded into the chamber 170 and placed on the substrate support 172. Then, the pressure in the chamber 170 is preferably set to be in a range of 6.66 to 400 Pa (50 to 3000 mTorr), more preferably in a range of 13.3 to 266.6 Pa (100 to 2000 mTorr). Further, the temperature of the wafer W is preferably set to be in a range of 0.1 to 120° C., more preferably in a range of 20 to 100° C. by the temperature controller 195 of the substrate support 172.

Next, the gas supply unit 173 supplies the HF gas and the $NH_3$ gas respectively diluted with the Ar gas and the $N_2$ gas into the chamber 170. The dilution gas may be either the Ar gas or the $N_2$ gas. The gas flow rate at this time is preferably set such that an HF gas flow rate is in a range of 50 to 500 sccm, an $NH_3$ gas flow rate is in a range of 50 to 500 sccm, an Ar gas flow rate is in a range of 100 to 600 sccm, and an $N_2$ gas flow rate is in a range of 100 to 600 sccm.

As a result, the HF gas and the $NH_3$ gas are adsorbed on the wafer W, and these gases react with the oxides including the oxide of the damage layer formed in the recesses of the pattern to thereby produce the ammonium fluoride-based compound.

Since the ammonium fluoride-based compound that is the reaction product can be sublimated by heat, the heating apparatus 105 can be used to remove the ammonium fluoride-based compound. However, the ammonium fluoride-based compound may be sublimated by repeatedly performing the reaction treatment and the heat treatment in the chamber 170 of the oxide removal apparatus 104 described in the present example.

Another example of the oxide removal apparatus 104 is a radical treatment apparatus that is configured to perform an oxide removal treatment using F radicals and N radicals formed by activating a processing gas containing $NF_3$ gas and $NH_3$ gas. Such an apparatus has the same configuration as the oxidation treatment apparatus 103 shown in FIG. 11 except that the gas supplied from the first gas supply unit 161 is replaced with the processing gas containing the $NF_3$ gas and the $NH_3$ gas. Further, when the oxidation treatment apparatus 103 is configured to allow the first gas supply unit 161 to supply the gas for the oxidation treatment and the gas for the oxide removal treatment, it is possible to realize an apparatus that can perform both of the oxidation treatment and the oxide removal treatment in a single processing chamber.

(Heating Apparatus)

The heating apparatus 105 installed in the processing system 100 may have a general configuration. For example, similar to the oxide removal apparatus 104 configured as the COR apparatus shown in FIG. 12, the heating apparatus 105 includes a chamber, a substrate support for placing a wafer in the chamber, a temperature controlling mechanism for heating the substrate support to a predetermined temperature, and a gas supply mechanism for supplying a processing gas for heat treatment. An inert gas such as $N_2$ gas and the like can be used as the processing gas.

In the above examples, the case where the plasma etching treatment, the oxidation treatment, the oxide removal treatment and the like are performed in-situ by the processing system 100 has been described. However, each of the plasma etching apparatus, the oxidation treatment apparatus, the oxide removal apparatus and the like may be used alone. Further, the processing system having the oxidation treatment apparatus, the oxide removal apparatus, and the heating apparatus may be used to perform the oxidation treatment and the oxide removal treatment on the wafer that has been subjected to the plasma etching.

<Second Example of the Processing System>

Figure 13:
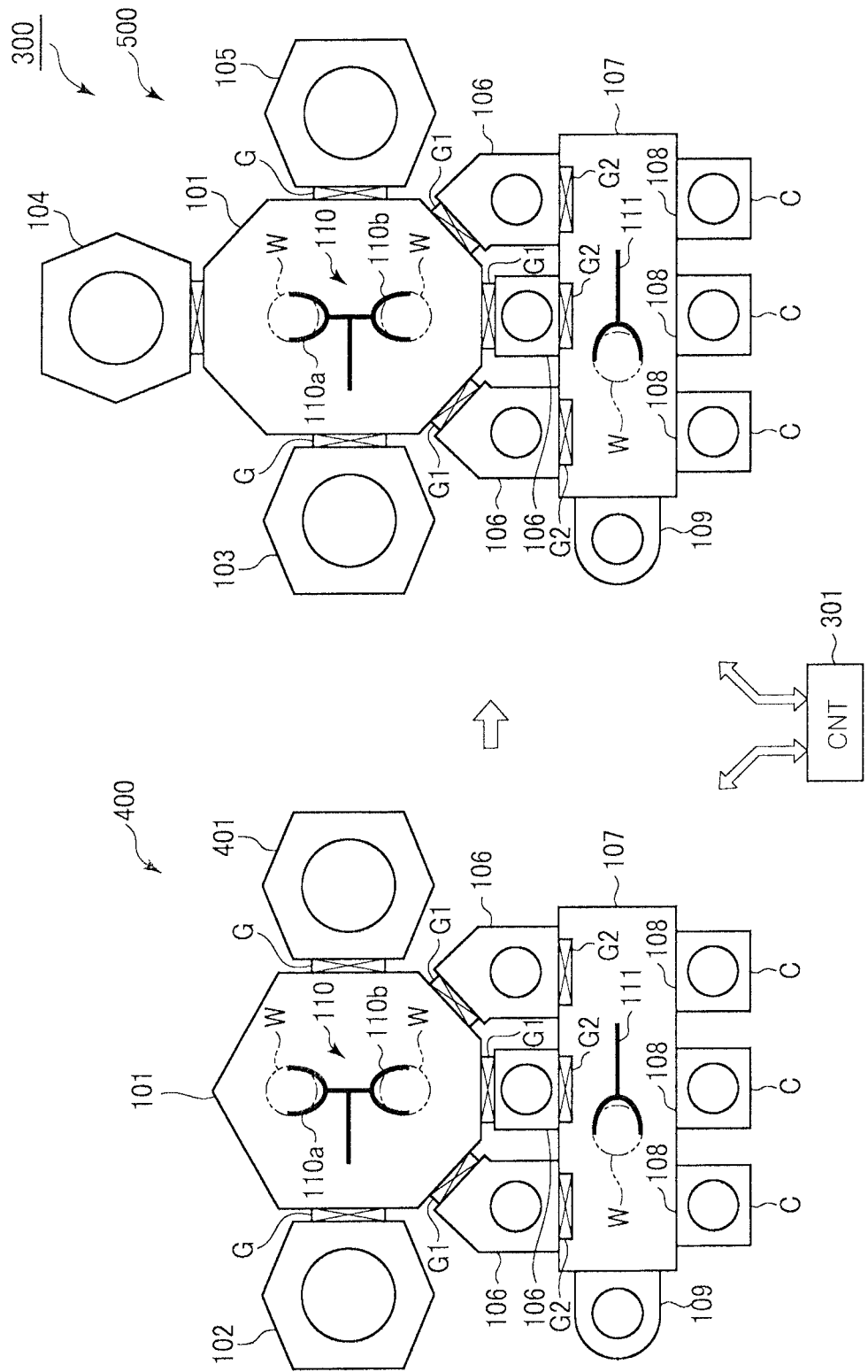
FIG. 13 is a schematic view showing a second example of a processing system used in the etching method of the third embodiment.

FIG. 13 is a schematic view showing a second example of a processing system used in the etching method of the third embodiment.

The processing system 300 of the second example includes a first processing section 400 configured to perform etching and ashing and a second processing section 500 configured to perform an oxidation treatment and an oxide removal treatment. The first processing section 400 and the second processing section 500 basically have the same configuration as the processing system 100 of the first example. Therefore, like reference numerals will be given to like parts and the redundant description thereof will be omitted. In other words, each of the first processing section 400 and the second processing section 500 includes a vacuum transfer chamber 101, load lock chambers 106, an atmospheric transfer chamber 107, an alignment chamber 109, and wafer transfer mechanisms 110 and 111, but the apparatuses connected to the vacuum transfer chamber 101 are different.

In the first processing section 400, a plasma etching apparatus 102 and an ashing apparatus 401 are connected to the vacuum transfer chamber 101. In the second processing section 500, an oxidation treatment apparatus 103, an oxide removal apparatus 104, and a heating apparatus 105 are connected to the vacuum transfer chamber 101.

Among the above apparatuses, the configurations of the plasma etching apparatus 102, the oxidation treatment apparatus 103, the oxide removal apparatus 104, and the heating apparatus 105 are the same as those described in the first example.

As for the ashing apparatus 401, a conventional ashing apparatus can be used. For example, an ashing apparatus generally uses excited oxygen, and an ashing apparatus configured to perform an ashing treatment by generating plasma of a gas containing oxygen in a chamber containing a substrate or an ashing apparatus configured to perform an ashing treatment by introducing an ozone gas into the chamber can be used. Further, the same configuration as the oxidation treatment apparatus 103 shown in FIG. 11 may be employed so that the ashing using radicals can be performed by using $O_2$ gas and a noble gas as the gas supplied from the first gas supply unit 161.

Further, the processing system 300 includes a general controller (CNT) 301. The general controller 301 includes a main controller having a CPU for controlling the operations of individual components of the processing system 300 including each processing apparatus of the first processing section 400 and the second processing section 500, the vacuum transfer chamber, the load lock chambers, and the like. The general controller 301 further includes an input device, an output device, a display device, and a storage device (storage medium). For example, the main controller allows the individual components of the processing system 300 to execute predetermined operations to perform the etching methods described above based on processing recipes stored in the storage medium set in the storage device or the storage medium installed in the storage device.

In the processing system 300 configured as described above, first, a carrier C accommodating the wafers W that are the substrates is set in the first processing section 400. In the first processing section 400, first, an etching target portion of the wafer W is etched by plasma of a processing gas containing a CF-based gas in the plasma etching apparatus 102. Then, a photoresist layer is removed by ashing in the ashing apparatus 401.

In the first processing section 400, the above-described process is simultaneously performed in a parallel manner for a plurality of wafers W. Then, after all of the wafers W in the carrier C have been processed, the carrier C accommodating the wafers W on each of which the ashing is also completely performed is conveyed to and set in the second processing section 500.

In the second processing section 500, first, an oxidation treatment is performed with oxygen-containing radicals and fluorine-containing radicals in the oxidation processing device 103, so that an oxide of a damage layer is mainly formed. Next, oxides including the oxide of the damage layer are removed by the oxide removal apparatus 104. When the COR treatment using HF gas and $NH_3$ gas is performed as the oxide removal treatment, the wafer W is heated by the heating apparatus 105 to remove the reaction product.

In the second processing section 500, the above-described process is simultaneously performed in a parallel manner for a plurality of wafers W. Then, the process is completed when all of the wafers W in the carrier C are processed.

The plasma etching treatment, the ashing treatment, the oxidation treatment, and the oxide removal treatment may be performed in-situ in the single processing system, or apparatuses for performing the above treatments may be used individually.

<Third Example of the Processing System>

Figure 14:
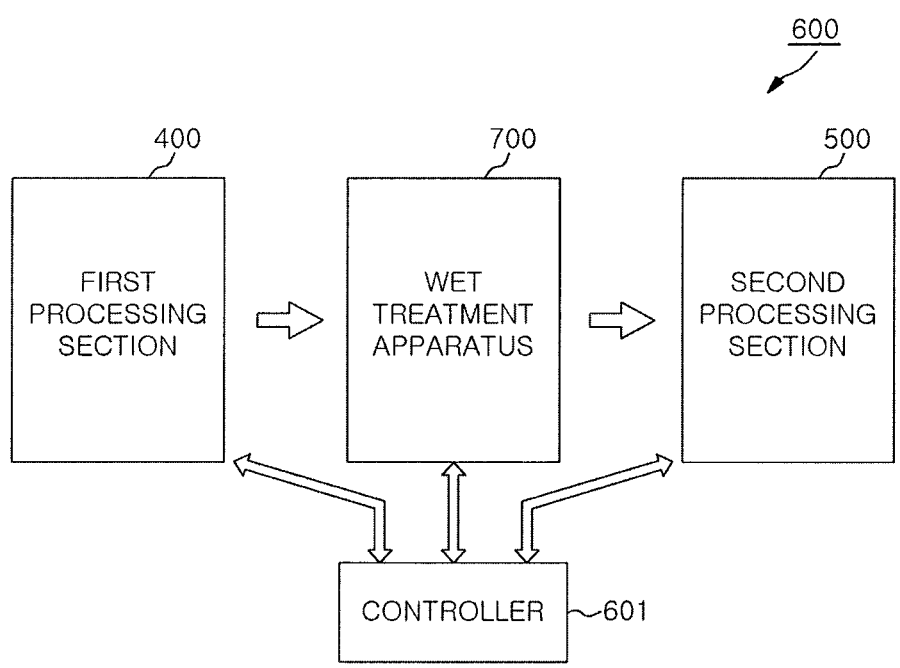
FIG. 14 is a schematic view showing a third example of a processing system used in the etching method of the fourth embodiment.

FIG. 14 is a block diagram showing a third example of a processing system used in the etching method of the fourth embodiment.

The processing system 600 of the third example has a wet treatment apparatus 700 in addition to the first processing section 400 and the second processing section 500 of the processing system 300 of the second example.

The wet treatment apparatus 700 is configured to perform the chemical treatment by immersing the wafer W in the chemical solution under the normal pressure or supplying the chemical solution onto the wafer W from a chemical solution nozzle while rotating a spin chuck holding the wafer W to form a liquid film.

Further, the processing system 600 includes a general controller 601. The general controller 601 includes a main controller having a CPU for controlling the operations of individual components of the processing system 600 including each processing apparatus of the first processing section 400 and the second processing section 500, the vacuum transfer chamber, the load lock chambers, and the wet treatment apparatus 700. The general controller 601 further includes an input device, an output device, a display device, and a storage device (storage medium). For example, the main controller allows the individual components of the processing system 600 to execute predetermined operations to perform the etching methods described above based on processing recipes stored in the storage medium set in the storage device or the storage medium installed in the storage device.

In the processing system 600 configured as described above, first, the carrier C accommodating the wafers W that are the substrates is set in the first processing section 400. In the first processing section 400, an etching target portion of the wafer W is etched by plasma of a processing gas containing a CF-based gas in the plasma etching apparatus 102. Then, a photoresist layer is removed by ashing in the ashing apparatus 401.

In the first processing unit 400, the above-described process is simultaneously performed in a parallel manner for a plurality of wafers W. Then, after all of the wafers W in the carrier C have been processed, the carrier C accommodating the wafers W on each of which the ashing is also completely performed is conveyed to and set in the wet treatment apparatus 700. Then, the wet treatment is performed by the wet treatment apparatus 700. Then, after the wet treatment is performed for all of the wafers W, the carrier C accommodating the processed wafers W is transferred to and set in the second processing section 500.

In the second processing unit 500, as in the processing system 300 of the second example, an oxidation treatment is performed in the oxidation treatment apparatus 103, so that an oxide of a damage layer is mainly formed. Next, oxides including the oxide of the damage layer are removed by the oxide removal apparatus 104. When the COR treatment is performed as the oxide removal treatment, the wafer W is heated by the heating apparatus 105 to remove the reaction product.

In the second processing section 500, the above-described process is simultaneously performed in a parallel manner for a plurality of wafers W. Then, the process is completed when all of the wafers W in the carrier C are processed.

The plasma etching treatment, the ashing treatment, the oxidation treatment, and the oxide removal treatment may be performed in-situ in the single processing system, or apparatuses for performing the above treatments may be used individually.

<Other Applications>

Although the embodiments have been described, the presently disclosed embodiments are considered in all respects to be illustrative and not restrictive. The above-described embodiments may be omitted, replaced, or changed in various forms without departing from the scope of the appended claims and the gist thereof.

For example, the apparatuses of the above described embodiments are merely examples, and apparatuses having various configurations can be used. Further, although the case where the semiconductor wafer is used as the substrate to be processed has been described, the substrate is not limited to the semiconductor wafer and may be another substrate such as a ceramic substrate, a flat panel display (FPD) substrate represented by a liquid crystal display (LCD) substrate, or the like.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

What is claimed is:

1. An etching method comprising:
   preparing a substrate having an etching target portion formed on a silicon-containing portion;
   plasma-etching the etching target portion of the substrate into a predetermined pattern by plasma of a processing gas containing a CF-based gas; and
   removing a damage layer formed due to implantation of C and F into the silicon-containing portion exposed at a bottom of the predetermined pattern by the plasma etching,
   wherein said removing the damage layer includes:
   by supplying oxygen-containing radicals and fluorine-containing radicals, etching the damage layer with the fluorine-containing radicals and oxidizing a remaining damage layer with the oxygen-containing radicals to modify the remaining damage layer into an oxide; and
   removing the oxide by a radical treatment or a chemical treatment with a gas.

2. The etching method of claim 1, wherein the etching target portion is a silicon oxide film.

3. The etching method of claim 1, wherein said etching the damage layer and said oxidizing the remaining damage layer are performed by using plasma generated by an oxygen-containing gas and a fluorine-containing gas.

4. The etching method of claim 3, wherein, in said etching the damage layer and said oxidizing the remaining damage layer, the oxygen-containing gas contains $O_2$ gas, and the fluorine-containing gas contains $NF_3$ gas, $SF_6$ gas, or $F_2$ gas.

5. The etching method of claim 4, wherein, in said etching the damage layer and said oxidizing the remaining damage layer, the oxygen-containing gas further contains $H_2$ gas.

6. The etching method of claim 4, wherein a volume ratio of the fluorine-containing gas to the oxygen-containing gas is 1% by volume (vol %) or less.

7. The etching method of claim 3, wherein said etching the damage layer and said oxidizing the remaining damage layer are performed by remote plasma that generates the plasma in a plasma generation space that is separate from a processing space where the substrate is placed.

8. The etching method of claim 3, wherein said etching the damage layer and said oxidizing the remaining damage layer are performed at a pressure in a range of 13.3 to 266.6 Pa and a temperature in a range of 0 to 120° C.

9. The etching method of claim 1, wherein said removing the oxide is performed by the chemical treatment with a processing gas containing a fluorine-containing gas.

10. The etching method of claim 9, wherein the processing gas containing the fluorine-containing gas contains an $H_2O$ gas or a reducing gas in addition to a fluorine-containing gas.

11. The etching method of claim 9, wherein the processing gas containing the fluorine-containing gas contains HF gas as the fluorine-containing gas and contains $NH_3$ gas as a reducing gas.

12. The etching method of claim 10, wherein said removing the oxide is performed at a pressure in a range of 6.66 to 400 Pa and a temperature in a range of 0 to 120° C.

13. The etching method of claim 11, wherein, in said removing the oxide, an ammonium fluoride-based compound produced after the chemical treatment is removed by heating.

14. The etching method of claim 1, wherein said removing the oxide is performed by the radical treatment with F radicals and N radicals formed by activating a processing gas containing $NF_3$ gas and $NH_3$ gas.

15. The etching method of claim 1, wherein a CF-based deposit remains as an etching residue after said plasma-etching is performed,
    in said removing the damage layer, the CF-based deposit is removed together with the damage layer,
    in said etching the damage layer and said oxidizing the remaining damage layer, an oxide of the CF-based deposit is formed together with the oxide of the damage layer, and
    in said removing the oxide, the oxide of the CF-based deposit is also removed.

16. The etching method of claim 1, wherein a photoresist layer used as an etching mask remains after said plasma-etching is performed, and the photoresist layer is removed by the oxygen-containing radicals of said etching the damage layer and said oxidizing the remaining damage layer.

17. The etching method of claim 1, further comprising:
ashing and removing a photoresist layer used as an etching mask remaining after said plasma-etching is performed,
wherein said removing the damage layer is performed after said ashing and removing the photoresist layer is performed.

18. The etching method of claim 17, further comprising: removing an ashing residue by a wet treatment after said ashing and removing the photoresist layer is performed,
wherein said removing the damage layer is performed after said removing the ashing residue.

19. A method of removing a damage layer that is formed due to implantation of C and F into a silicon-containing portion exposed at a bottom of a predetermined pattern that is formed by etching a substrate having an etching target portion formed on the silicon-containing portion by plasma of a processing gas containing a CF-based gas, the method comprising:
by supplying oxygen-containing radicals and fluorine-containing radicals, etching the damage layer with the fluorine-containing radicals and oxidizing a remaining damage layer with the oxygen-containing radicals to modify the remaining damage layer into an oxide; and
removing the oxide by a radical treatment or a chemical treatment with a gas.

20. A non-transitory computer-readable storage medium storing a computer executable program for controlling a processing system and the program, when executed by a computer, performs an etching method comprising:
preparing a substrate having an etching target portion formed on a silicon-containing portion;
plasma-etching the etching target portion of the substrate into a predetermined pattern by plasma of a processing gas containing a CF-based gas; and
removing a damage layer formed due to implantation of C and F into the silicon-containing portion exposed at a bottom of the predetermined pattern by the plasma etching,
wherein said removing the damage layer includes:
by supplying oxygen-containing radicals and fluorine-containing radicals, etching the damage layer with the fluorine-containing radicals and oxidizing a remaining damage layer with the oxygen-containing radicals to modify the remaining damage layer into an oxide; and
removing the oxide by a radical treatment or a chemical treatment with a gas.

* * * * *